(12) United States Patent
Cadee et al.

(10) Patent No.: US 11,378,893 B2
(45) Date of Patent: *Jul. 5, 2022

(54) LITHOGRAPHIC APPARATUS AND DEVICE MANUFACTURING METHOD INVOLVING A HEATER

(71) Applicant: ASML NETHERLANDS B.V., Veldhoven (NL)

(72) Inventors: Theodorus Petrus Maria Cadee, Vlierden (NL); Johannes Henricus Wilhelmus Jacobs, Eindhoven (NL); Nicolaas Ten Kate, Almkerk (NL); Erik Roelof Loopstra, Heeze (NL); Aschwin Lodewijk Hendricus Johannes Van Meer, Roosendaal (NL); Jeroen Johannes Sophia Maria Mertens, Duizel (NL); Christianus Gerardus Maria De Mol, Son en Breugel (NL); Marcel Johannus Elisabeth Hubertus Muitjens, Nuth (NL); Antonius Johannus Van Der Net, Tilburg (NL); Joost Jeroen Ottens, Veldhoven (NL); Johannes Anna Quaedackers, Nijmegen (NL); Maria Elisabeth Reuhman-Huisken, Waalre (NL); Marco Koert Stavenga, Eindhoven (NL); Patricius Aloysius Jacobus Tinnemans, Hapert (NL); Martinus Cornelis Maria Verhagen, Valkenswaard (NL); Jacobus Johannus Leonardus Hendricus Verspay, Thorn (NL); Frederik Eduard De Jong, Eindhoven (NL); Koen Goorman, Eindhoven (NL); Boris Menchtchikov, Eindhoven (NL); Herman Boom, Eindhoven (NL); Stoyan Nihtianov, Eindhoven (NL); Richard Moerman, Son (NL); Martin Frans Pierre Smeets, Veldhoven (NL); Bart Leonard Peter Schoondermark, Vught (NL); Franciscus Johannes Joseph Janssen, Eindhoven (NL); Michel Riepen, Bergschenhoek (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/098,073

(22) Filed: Nov. 13, 2020

(65) Prior Publication Data
US 2021/0063898 A1 Mar. 4, 2021

Related U.S. Application Data

(63) Continuation of application No. 16/376,535, filed on Apr. 5, 2019, now Pat. No. 10,838,310, which is a
(Continued)

(51) Int. Cl.
*G03F 7/20* (2006.01)

(52) U.S. Cl.
CPC ...... *G03F 7/70808* (2013.01); *G03F 7/70341* (2013.01); *G03F 7/70841* (2013.01); *G03F 7/70875* (2013.01)

(58) Field of Classification Search
CPC ............. G03F 7/70341; G03F 7/70808; G03F 7/70841; G03F 7/70875; H01L 21/0274
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |

(Continued)

FOREIGN PATENT DOCUMENTS

| | | |
|---|---|---|
| CN | 1499298 | 5/2004 |
| DE | 206 607 | 2/1984 |

(Continued)

OTHER PUBLICATIONS

M. Switkes et al., "Immersion Lithography at 157 nm", MIT Lincoln Lab, Orlando 2001-1, Dec. 17, 2001.
(Continued)

*Primary Examiner* — Peter B Kim
(74) *Attorney, Agent, or Firm* — Pillsbury Winthrop Shaw Pittman, LLP

(57) ABSTRACT

A lithographic apparatus is described having a liquid supply system configured to at least partly fill a space between a
(Continued)

projection system of the lithographic apparatus and a substrate with liquid, a barrier member arranged to substantially contain the liquid within the space, and a heater.

20 Claims, 25 Drawing Sheets

Related U.S. Application Data continuation of application No. 14/882,241, filed on Oct. 13, 2015, now Pat. No. 10,254,663, which is a continuation of application No. 13/288,831, filed on Nov. 3, 2011, now Pat. No. 9,188,880, which is a continuation of application No. 12/869,560, filed on Aug. 26, 2010, now Pat. No. 9,268,242, which is a continuation of application No. 11/205,325, filed on Aug. 17, 2005, now Pat. No. 7,804,575, which is a continuation-in-part of application No. 10/917,535, filed on Aug. 13, 2004, now Pat. No. 7,304,715.

(56) References Cited

U.S. PATENT DOCUMENTS

| | | | |
|---|---|---|---|
| 4,213,698 A | 7/1980 | Firtion et al. | |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,503,335 A | 3/1985 | Takahashi | |
| 4,509,852 A | 4/1985 | Tabarelli et al. | |
| 4,564,284 A | 1/1986 | Tsutsui | |
| 4,704,348 A | 11/1987 | Koizumi | |
| 4,730,900 A | 3/1988 | Uehara et al. | |
| 4,825,247 A | 4/1989 | Kemi et al. | |
| 5,034,688 A | 7/1991 | Moulene et al. | |
| 5,040,020 A | 8/1991 | Rauschenbach et al. | 355/53 |
| 5,063,582 A | 11/1991 | Mori | |
| 5,121,256 A | 6/1992 | Corle et al. | 359/664 |
| 5,134,436 A | 7/1992 | Fujioka | |
| 5,137,349 A | 8/1992 | Taniguchi et al. | |
| 5,142,132 A | 8/1992 | MacDonald et al. | |
| 5,231,291 A | 7/1993 | Amemiya et al. | |
| 5,294,778 A | 3/1994 | Carman et al. | |
| 5,402,224 A | 3/1995 | Hirukawa et al. | |
| 5,577,552 A | 11/1996 | Ebinuma et al. | |
| 5,610,683 A | 3/1997 | Takahashi | 355/53 |
| 5,638,687 A | 6/1997 | Mizohata et al. | |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 5,974,816 A | 11/1999 | Endo | |
| 6,191,429 B1 | 2/2001 | Suwa | 250/548 |
| 6,225,224 B1 | 5/2001 | Pandey et al. | |
| 6,236,634 B1 | 5/2001 | Lee et al. | 369/112 |
| 6,556,414 B2 | 4/2003 | Kosakai | |
| 6,560,032 B2 | 5/2003 | Hatano | 359/656 |
| 6,600,547 B2 | 7/2003 | Watson et al. | |
| 6,603,130 B1 | 8/2003 | Bisschops et al. | 250/492.1 |
| 6,633,365 B2 | 10/2003 | Suenaga | 355/53 |
| 6,699,630 B2 | 3/2004 | Ota | |
| 6,731,371 B1 | 5/2004 | Shiraishi | |
| 6,809,794 B1 | 10/2004 | Sewell | |
| 6,867,844 B2 | 3/2005 | Vogel et al. | |
| 6,882,403 B1 | 4/2005 | Shirata | |
| 6,954,255 B2 | 10/2005 | Hasegawa et al. | |
| 7,061,573 B2 | 6/2006 | Tsukamoto | |
| 7,193,232 B2 | 3/2007 | Lof et al. | |
| 7,304,715 B2 | 12/2007 | Cadee et al. | |
| 7,471,371 B2 | 12/2008 | Kameyama | |
| 9,188,880 B2 | 11/2015 | Cadee | |
| 9,268,236 B2 | 2/2016 | Jacobs | |
| 9,268,242 B2 | 2/2016 | Cadee | |
| 10,838,310 B2 * | 11/2020 | Cadee | G03F 7/70808 |
| 11,003,094 B2 * | 5/2021 | Lafarre | G03F 7/707 |
| 2001/0055102 A1 | 12/2001 | Emoto | |
| 2002/0002944 A1 | 1/2002 | Shirley | |
| 2002/0020821 A1 | 2/2002 | Van Santen et al. | 250/492 |
| 2002/0163629 A1 | 11/2002 | Switkes et al. | 355/53 |
| 2003/0035090 A1 | 2/2003 | Imai et al. | |
| 2003/0098966 A1 | 5/2003 | Korenaga | |
| 2003/0123040 A1 | 7/2003 | Almogy | 355/69 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0035569 A1 | 2/2004 | Suenaga et al. | |
| 2004/0075895 A1 | 4/2004 | Lin | 359/380 |
| 2004/0109237 A1 | 6/2004 | Epple et al. | |
| 2004/0114117 A1 | 6/2004 | Bleeker | |
| 2004/0119954 A1 | 6/2004 | Kawashima et al. | 355/30 |
| 2004/0125351 A1 | 7/2004 | Krautschik et al. | 355/53 |
| 2004/0130688 A1 | 7/2004 | Emoto | |
| 2004/0135099 A1 | 7/2004 | Simon et al. | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0179183 A1 * | 9/2004 | Van Ballegoij | G03F 7/70783 355/72 |
| 2004/0207824 A1 | 10/2004 | Lof et al. | |
| 2004/0211920 A1 | 10/2004 | Derksen et al. | |
| 2005/0007569 A1 | 1/2005 | Streefkerk et al. | |
| 2005/0094116 A1 | 5/2005 | Flagello et al. | |
| 2005/0110973 A1 | 5/2005 | Streefkerk et al. | |
| 2005/0132914 A1 | 6/2005 | Mulkens et al. | |
| 2005/0134815 A1 | 6/2005 | Van Santen et al. | |
| 2005/0146694 A1 | 7/2005 | Tokita | 355/30 |
| 2005/0174549 A1 | 8/2005 | Duineveld et al. | |
| 2005/0175940 A1 | 8/2005 | Dierichs | |
| 2005/0213066 A1 | 9/2005 | Sumiyoshi | 355/53 |
| 2005/0213067 A1 | 9/2005 | Van Der Feltz et al. | |
| 2005/0229854 A1 | 10/2005 | Moroz | |
| 2005/0259234 A1 | 11/2005 | Hirukawa et al. | |
| 2005/0286033 A1 | 12/2005 | Lin et al. | |
| 2006/0028632 A1 | 2/2006 | Hazelton et al. | |
| 2006/0033898 A1 | 2/2006 | Cadee et al. | |
| 2006/0033901 A1 | 2/2006 | Hara | |
| 2006/0034344 A1 | 2/2006 | Hirano et al. | |
| 2006/0261288 A1 | 11/2006 | Van Santen | |
| 2007/0007316 A1 | 1/2007 | Witczak | |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 605 103 A1 | 7/1994 |
| EP | 1039511 | 9/2000 |
| EP | 1 420 300 A3 | 8/2005 |
| EP | 1 571 697 | 9/2005 |
| EP | 1 420 298 A3 | 10/2005 |
| EP | 1 650 604 A2 | 4/2006 |
| EP | 1 650 604 A3 | 5/2006 |
| EP | 2 453 465 | 5/2012 |
| FR | 2474708 | 7/1981 |
| GB | 2 138 163 A | 10/1984 |
| JP | 58-202448 | 11/1983 |
| JP | 62-065326 | 3/1987 |
| JP | 62-121417 | 6/1987 |
| JP | 63-157419 | 6/1988 |
| JP | H03-003222 | 1/1991 |
| JP | 4-028216 | 1/1992 |
| JP | 04-305915 | 10/1992 |
| JP | 04-305917 | 10/1992 |
| JP | 6-84757 | 3/1994 |
| JP | 06-124873 | 5/1994 |
| JP | H07-106317 | 4/1995 |
| JP | 07-132262 | 5/1995 |
| JP | 07-220990 | 8/1995 |
| JP | H10-189242 | 7/1998 |
| JP | 10-228661 | 8/1998 |
| JP | 10-255319 | 9/1998 |

(56) References Cited

FOREIGN PATENT DOCUMENTS

| | | |
|---|---|---|
| JP | 10-284405 | 10/1998 |
| JP | 10-303114 | 11/1998 |
| JP | 10-340846 | 12/1998 |
| JP | 11-176727 | 7/1999 |
| JP | H11-195602 | 7/1999 |
| JP | 2000-058436 | 2/2000 |
| JP | 2001-091849 | 4/2001 |
| JP | 2003-151898 | 5/2003 |
| JP | 2004-165666 | 6/2004 |
| JP | 2004-193252 | 7/2004 |
| JP | 2005-012201 | 1/2005 |
| JP | 2005-051231 | 2/2005 |
| JP | 2005-236121 | 9/2005 |
| JP | 2005-252247 | 9/2005 |
| JP | 2005-310933 | 11/2005 |
| JP | 2006-13130 | 1/2006 |
| JP | 2006-510146 | 3/2006 |
| JP | 2007-519238 | 7/2007 |
| JP | 2008-504708 | 2/2008 |
| JP | 4-362867 | 11/2009 |
| JP | 2010-034605 | 2/2010 |
| JP | 2014-057105 | 3/2014 |
| KR | 1999-0034784 | 5/1999 |
| TW | 454233 B | 9/2001 |
| WO | WO 92/05432 | 4/1992 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/086470 | 7/2004 |
| WO | WO 2004/053596 A2 | 10/2004 |
| WO | 2005/071491 | 8/2005 |
| WO | WO 2005/071491 A2 | 8/2005 |
| WO | WO 2005/076324 | 8/2005 |
| WO | WO 2006/003373 | 1/2006 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
Translation of "Immersion Aligner," Ushida et al, Nov. 13, 1998, JP 10-303114, Japan.
Translation of "Exposure Apparatus and Device Manufacturing Method," Hirukawa et al., filed Dec. 8, 2003, PCT/JP2003/015675, Japan.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).

Australian Search Report issued for Singapore Patent Application No. 200505017-4, dated Aug. 21, 2006.
European Search Report issued for European Patent Application No. 06251863.4-1226, dated Sep. 25, 2006.
Wakamatsu et al. "New Chemical Removing and Air Cooling Technology for Clean Room Recirculation Air Using Chilled Pure Water Showering Method." Oct. 2001. IEEE. pp. 485-488.
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithogrpahy", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "⅛μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
English Translation of Japanese Official Action dated Nov. 4, 2008 in Japanese Application No. 2005-233909.
S. Owa et al., "Update on 193nm immersion exposure tool", Litho Forum, International Sematech, Los Angeles, Jan. 27-29, 2004, Slide Nos. 1-51.
H. Hata, "The Development of Immersion Exposure Tools", Litho Forum, International Sematech, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, J. Microlith., Microfab., Microsyst. 1(1):7-12 (2002).
European Search Report for EP Patent Application No. 05254783.3, dated Jan. 10, 2006.
T. Honda et al., "ArF Immersion Lithography: Critical Optical Issues", Proc. of SPIE, vol. 5377, pp. 319-328, May 2004.
Taiwanese Office Action issued for Taiwan Patent Application No. 094127593, dated Jun. 12, 2007.
Written Opinion for Singapore Application/Patent No. 0701400-4 dated Apr. 29, 2009.
Korean Office Action issued for Korean Patent Application No. 10-2005-0074411, dated Sep. 27, 2006.
GE General Eastern Instruments, "Humidity Control in Clean Rooms," Accessed Jul. 26, 2007, Cole-Parmer Technical Library, http://www.coleparmer.com/techinfo/techinfo.asp?htmlfile=RHinCLeanRooms.htm&ID=640.
Chinese Office Action dated Jul. 25, 2011 in corresponding Chinese Patent Application No. 201010186587.1.
U.S. Office Action dated Oct. 3, 2013 in corresponding U.S. Appl. No. 12/869,560.
U.S. Office Action dated Dec. 11, 2014 in corresponding U.S. Appl. No. 12/869,560.
U.S. Office Action dated Apr. 2, 2015 in corresponding U.S. Appl. No. 12/869,560.
Japanese Office Action dated Oct. 4, 2011 in corresponding Japanese Patent Application No. 2009-024156.

\* cited by examiner

LITHOGRAPHIC APPARATUS AND DEVICE MANUFACTURING METHOD INVOLVING A HEATER

This application is a continuation of U.S. patent application Ser. No. 16/376,535, filed Apr. 5, 2019, now allowed, which is a continuation of U.S. patent application Ser. No. 14/882,241, filed Oct. 13, 2015, now U.S. Pat. No. 10,254,663, which is a continuation of U.S. patent application Ser. No. 13/288,831, filed Nov. 3, 2011, now U.S. Pat. No. 9,188,880, which is a continuation of U.S. patent application Ser. No. 12/869,560, filed Aug. 26, 2010, now U.S. Pat. No. 9,268,242, which is a continuation of U.S. patent application Ser. No. 11/205,325, filed Aug. 17, 2005, now U.S. Pat. No. 7,804,575, which is a continuation-in-part of U.S. patent application Ser. No. 10/917,535, filed Aug. 13, 2004, now U.S. Pat. No. 7,304,715, the entire contents of each foregoing application is hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2, the liquid is supplied along the direction of movement of the substrate relative to the final element, though this does not need to be the case. Various orientations and numbers of in- and out-lets positioned around the final element are possible. One example is illustrated in FIG. 3 in which four sets of an inlet with an outlet on either side are provided in a regular pattern around the final element.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although providing improved resolution, the introduction of an immersion liquid may cause errors in the image generated on the substrate, including alignment errors between one layer and the next (i.e. overlay errors), defocus and aberrations.

SUMMARY

It is desirable to provide a system that reduces lithography errors arising from the immersion liquid.

According to an aspect of the invention, there is provided a lithographic apparatus, comprising: a substrate table constructed to hold a substrate; a projection system configured to project a patterned radiation beam onto a target portion of the substrate; a liquid supply system configured to at least partly fill a space between the projection system and the substrate with liquid; a barrier member arranged to substantially contain the liquid within the space between the projection system and the substrate; and a liquid evaporation controller arranged to control a net rate of evaporation of liquid supplied by the liquid supply system.

According to an aspect of the invention, there is provided a lithographic apparatus, comprising: a substrate table constructed to hold a substrate; a projection system configured to project a patterned radiation beam onto a target portion of the substrate; a liquid supply system configured to at least partly fill a space between the projection system and the substrate with liquid; a barrier member arranged to substantially contain the liquid within the space between the projection system and the substrate; a substrate table displacement system, arranged to move the substrate table along a predetermined path relative to the barrier member, thereby moving the target portion over the surface of the substrate; and a microwave source and microwave containment device, together configured to supply heat to liquid on the surface of the substrate.

According to an aspect of the invention, there is provided a lithographic apparatus, comprising: a substrate table constructed to hold a substrate; a projection system configured to project a patterned radiation beam onto a target portion of the substrate; a liquid supply system configured to at least partly fill a space between the projection system and the substrate with liquid; a barrier member arranged to substantially contain the liquid within the space between the projection system and the substrate; a substrate table displacement system, arranged to move the substrate table along a predetermined path relative to the barrier member, thereby moving the target portion over the surface of the substrate; and a substrate heater configured to heat at least a portion of the substrate according to a position of the substrate table relative to the barrier member, or a velocity of the substrate table relative to the barrier member, or an acceleration of the substrate table relative to the barrier member, or a predetermined path of the substrate table relative to the barrier member, or a local substrate temperature, or a local substrate table temperature, or any combination thereof.

According to an aspect of the invention, there is provided a device manufacturing method, comprising: projecting a patterned radiation beam through a liquid onto a target portion of a substrate; and controlling a net rate of evaporation of the liquid.

According to an aspect of the invention, there is provided a device manufacturing method, comprising: projecting a patterned radiation beam through a liquid onto a target portion of the substrate; moving a substrate table holding the substrate along a predetermined path relative to a seal member used to contain the liquid, thereby moving the target portion over a surface of the substrate; and heating liquid on the surface of the substrate using microwaves.

According to an aspect of the invention, there is provided a device manufacturing method, comprising: projecting a patterned radiation beam through a liquid onto a target portion of a substrate; moving a substrate table holding the substrate along a predetermined path relative to a seal member used to contain the liquid, thereby moving the target portion over a surface of the substrate; and heating at least a portion of the substrate according to a position of the substrate table relative to the seal member, or a velocity of the substrate table relative to the seal member, or an acceleration of the substrate table relative to the seal member, or a predetermined path of the substrate table relative to the seal member, or a local substrate temperature, or a local substrate table temperature, or any combination thereof.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
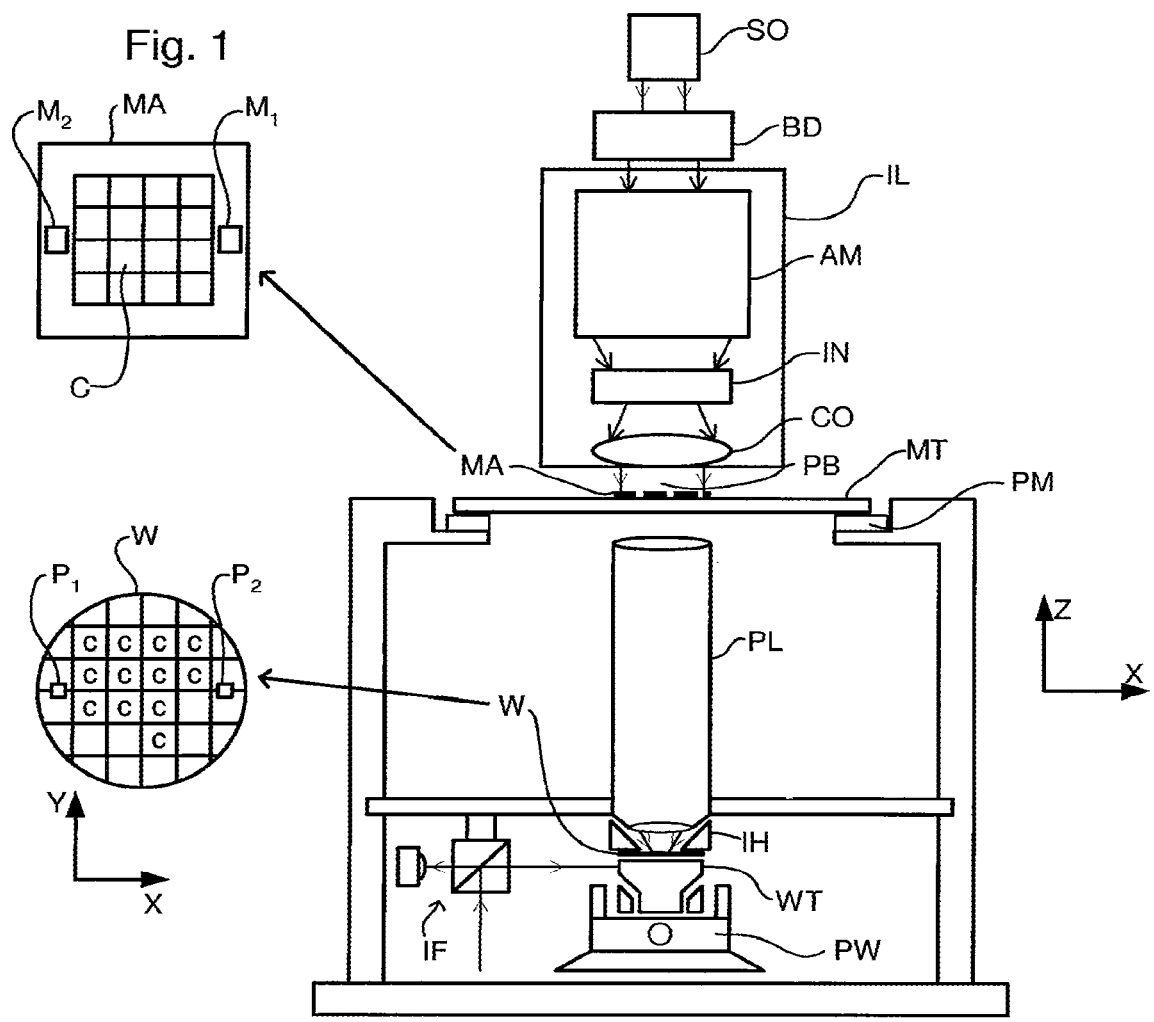
FIG. 1 depicts a lithographic apparatus according to an embodiment of the invention.
Figure 2:
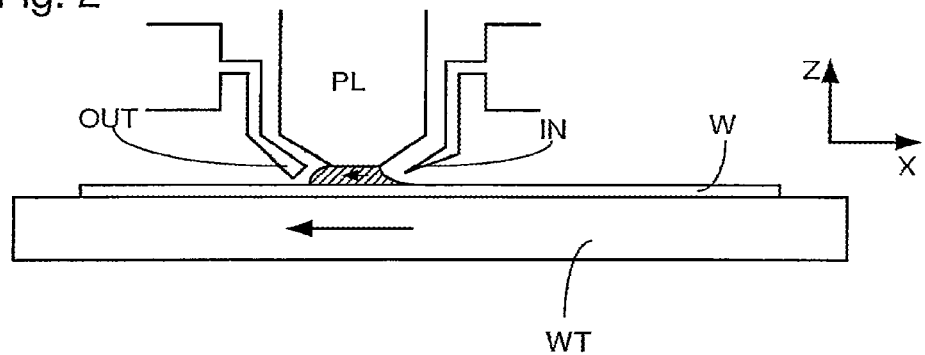
FIGS. 2 and 3 depict a liquid supply system for use in a lithographic projection apparatus.
Figure 3:
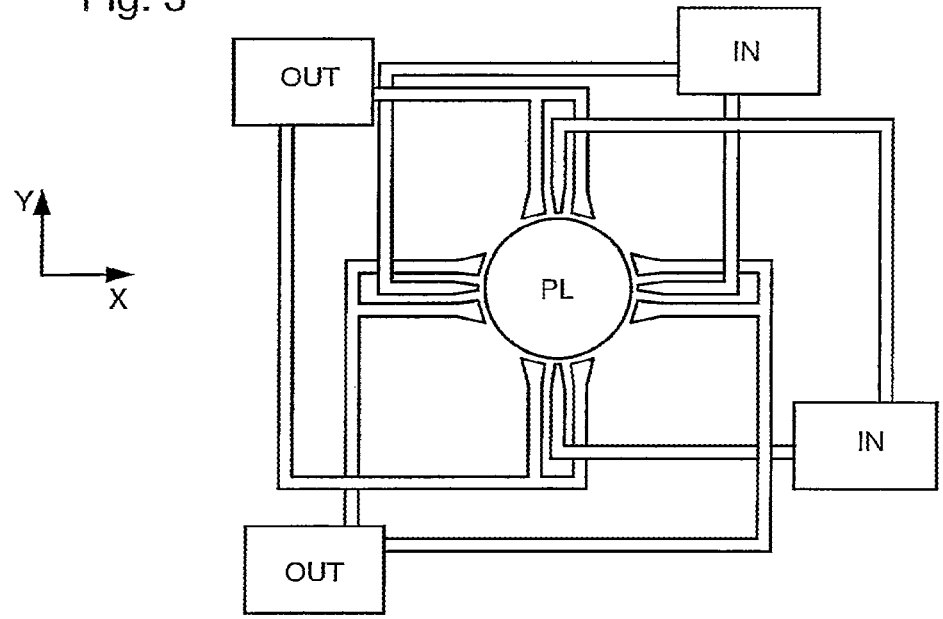

FIG. 1 schematically depicts a lithographic apparatus according to one embodiment of the invention. The apparatus comprises:
- an illumination system (illuminator) IL configured to condition a radiation beam PB (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure. The substrate W may be held directly by the substrate table WT (sometimes referred to as a mirror block) and may be held by a substrate holder (sometimes referred to as a burl plate or chuck), which is in turn held by the substrate table WT.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. Having traversed the patterning device, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT may be moved accurately, e.g. so as to position different target portions C in the path of the radiation beam PB. Similarly, the first positioner PM and another position sensor (which is not explicitly depicted in FIG. 1) may be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4A:
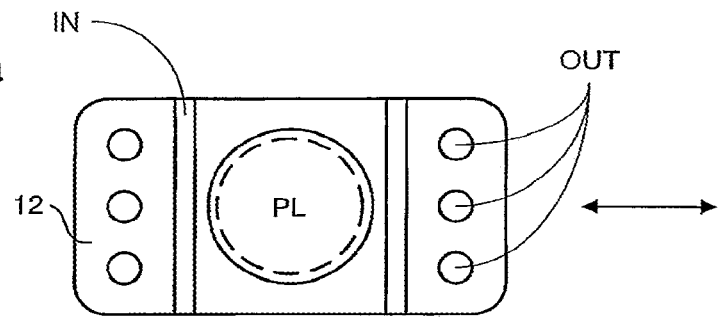
FIGS. 4a and 4b depict other liquid supply systems for use in a lithographic projection apparatus.
Figure 4A:
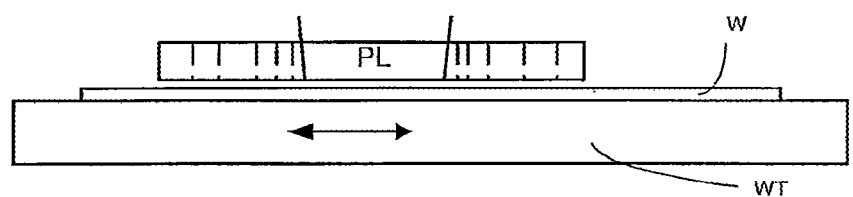

A further immersion lithography solution with a localized liquid supply system is shown in FIG. 4a. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a barrier member which extends along at least a part of a boundary of the space between the final element of the projection system and the substrate table. The barrier member is substantially stationary relative to the projection system in the XY plane though there may be some relative movement in the Z direction (in the direction of the optical axis). In an embodiment, a seal is formed between the barrier member and the surface of the substrate. The seal may be a contactless seal such as a gas seal. Such a system is disclosed in United States patent application publication no. US 2004-0207824 and European patent application publication no. EP 1420298, each hereby incorporated in its entirety by reference.

Figure 4B:
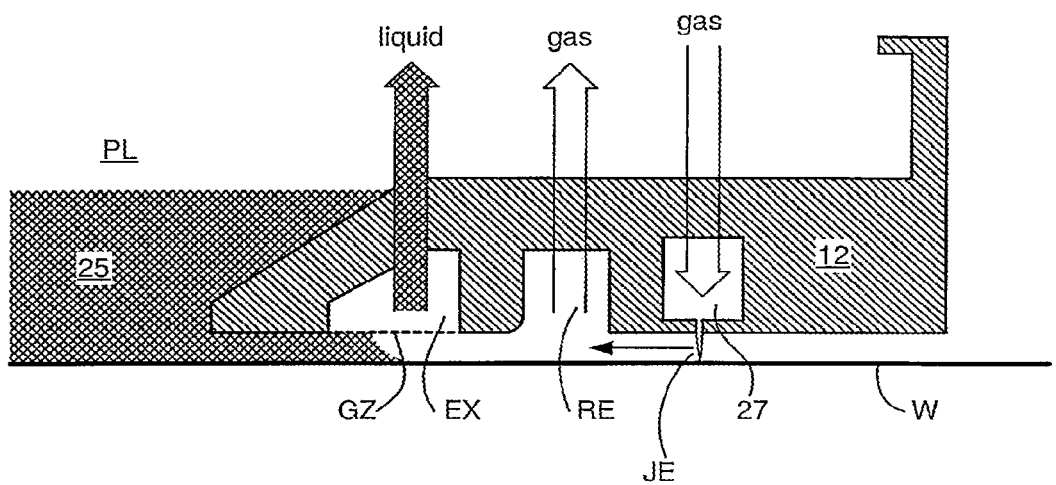

FIG. 4b shows an example arrangement for a barrier member 12 configured to contain an immersion liquid in the localized area 25 under the projection system PL. The barrier member 12 is provided with an extractor EX configured to extract liquid from the localized area 25 through a gauze GZ. The extractor EX may extract both liquid and gas or only liquid. A recess RE is provided radially outwardly of the extractor EX and a gas seal 27 is provided radially outwardly of the recess RE. The gas seal 27 forms a jet of gas JE which is used to dry the surface of the substrate W and/or reduce the amount of liquid that escapes from the barrier member 12.

According to an aspect of the invention, overlay errors and other problems linked to the presence of an immersion liquid and barrier member 12 may be reduced by a liquid evaporation controller, which targets and controls the rate of evaporation of immersion liquid in the region of the substrate. Molecules of liquid absorb energy from the surroundings in order to evaporate and, particularly if pumped away, the cooling that results may result in significant and non-uniform variations in the temperature of critical components such as the substrate W. Thermally-induced distortions may lead to errors in the image finally written to the substrate. For example, evaporation of immersion liquid left behind on the substrate after the barrier member 12 has passed by may cause local temperature drops of up to 3K. As a result of this, over 20 nm single machine overlay error might result.

Figure 5:
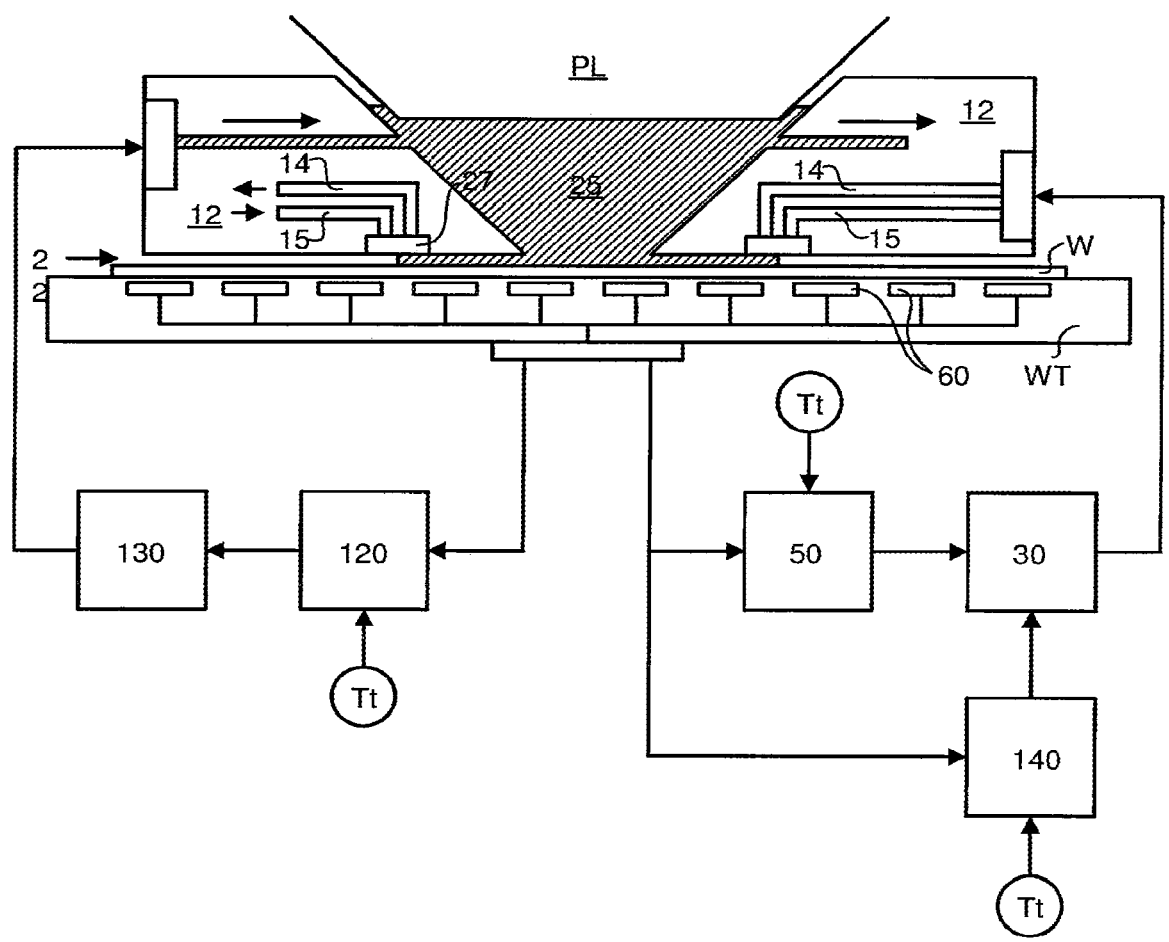
FIG. 5 depicts a barrier member according to an embodiment of the invention, showing interaction with a pressurized gas humidity controller, an immersion liquid temperature controller and a pressurized gas temperature controller.

FIG. 5 shows an arrangement of the barrier member 12 according to an embodiment of the invention. Immersion liquid is contained within an immersion reservoir 25 located between the final element of the projection system PL and the substrate W. Immersion liquid is contained within the immersion reservoir 25 by the body of the barrier member 12 and by a gas seal 27 on its lower periphery, which limits the amount of immersion liquid that escapes from the immersion reservoir 25 through gap 22. The gas seal 27 is connected to a pressurized gas supply system 30, which supplies pressurized gas to the gas seal 27 via a pressurized gas outlet and a pressurized gas supply pipe 15. Gas is pumped away via a vacuum exhaust inlet and a vacuum exhaust pipe 14. Immersion liquid that evaporates in the region of the gas seal 27 may be pumped away via the vacuum exhaust inlet 17. Alternatively, liquid that escapes beyond the gas seal 27 either into the region underneath the barrier member 12 in the gap 22 or beyond the outer edges of the barrier member 12, may evaporate into the environment outside the substrate W outside of the barrier member 12.

Where a substance exists both in liquid form and in gaseous form, it is normally the case that a dynamic equilibrium will exist with a rate of evaporation of liquid being balanced against a rate of condensation of vapor. The amount of cooling caused by evaporation will therefore be offset by a heating caused by condensation (where high energy gaseous molecules yield energy to their surroundings as part of the transition to the lower energy liquid state). The cooling power therefore depends on the net rate of evaporation (i.e. the difference between the number of molecules entering the gaseous state from the liquid per unit time and the number of molecules entering the liquid state from the gaseous state per unit time). Both condensation and evaporation are statistical effects and increasing the number of molecules involved will increase the rate of either process. Therefore, increasing the vapor concentration will increase the rate of condensation and lead to a reduction in the net rate of evaporation. Where the vapor consists of water molecules, this concentration is directly related to the relative humidity, defined as the amount of water vapor present as a percentage of the maximum quantity that could be present at a given temperature.

This understanding is exploited according to an embodiment of the invention to control the cooling caused by evaporation of immersion liquid. As illustrated in FIG. 5, a pressurized gas humidity controller 50, which is provided configured to interact with the pressurized gas supply system 30 to provide pressurized gas to the gas seal 27 with a relative humidity controlled to be greater than about 10%. Increasing the relative humidity of the gas increases the rate of condensation and therefore decreases the net rate of evaporation and the cooling caused thereby. In an embodiment, the relative humidity is arranged to be within a predetermined range determined by reference to calibration measurements. For the purposes of controlling cooling, in general, the higher the relative humidity the better. However, for very high relative humidities, the barrier member 12 may leave excessive quantities of water in its wake. Furthermore, if insufficient mechanisms are provided for humid gas extraction near the outer diameter of the barrier member, humid gas may leave and interfere with the operation of position sensor IF. Therefore, the upper limit will in general be dependent on details of the barrier member construction and/or configuration. Additionally or alternatively, the predetermined range may be greater than about 40%. High relative humidities such as these may be achieved by using lower working pressures than might otherwise be selected for the purposes of achieving optimal sealing properties (6 bar may typically be used). Ideally, a working pressure should be chosen that is as close as possible to atmospheric pressure, while still providing sufficient flow rate for the gas seal 27 to perform its function. The lower the working pressure, the less the relative humidity will be reduced when the pressurized gas expands on leaving the pressurized gas supply system 30.

The pressurized gas humidity controller 50 may be arranged to be responsive to changes in the temperature of the substrate W and/or substrate table WT. These temperature changes may be determined via one or more temperature sensors 60 arranged, for example, in the substrate table WT. According to an embodiment of the invention, the pressurized gas humidity controller 50 is arranged to compare the temperatures of the substrate W and/or substrate table WT and/or substrate holder, measured at one or more points by the temperature sensor(s) 60, with a target temperature or temperatures Tt. That is to say, where a single temperature sensor 60 is present, the pressurized gas humidity controller 50 compares this one temperature reading with a single target temperature Tt. Where a plurality of temperature sensors 60 are present, the pressurized gas humidity controller 50 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used). The pressurized gas humidity controller 50 may then adjust the relative humidity of the pressurized gas in order to reduce a difference between the measured and target temperature(s), the efficiency of the process may be controlled by a feedback controller such as a PID system.

Figure 6:
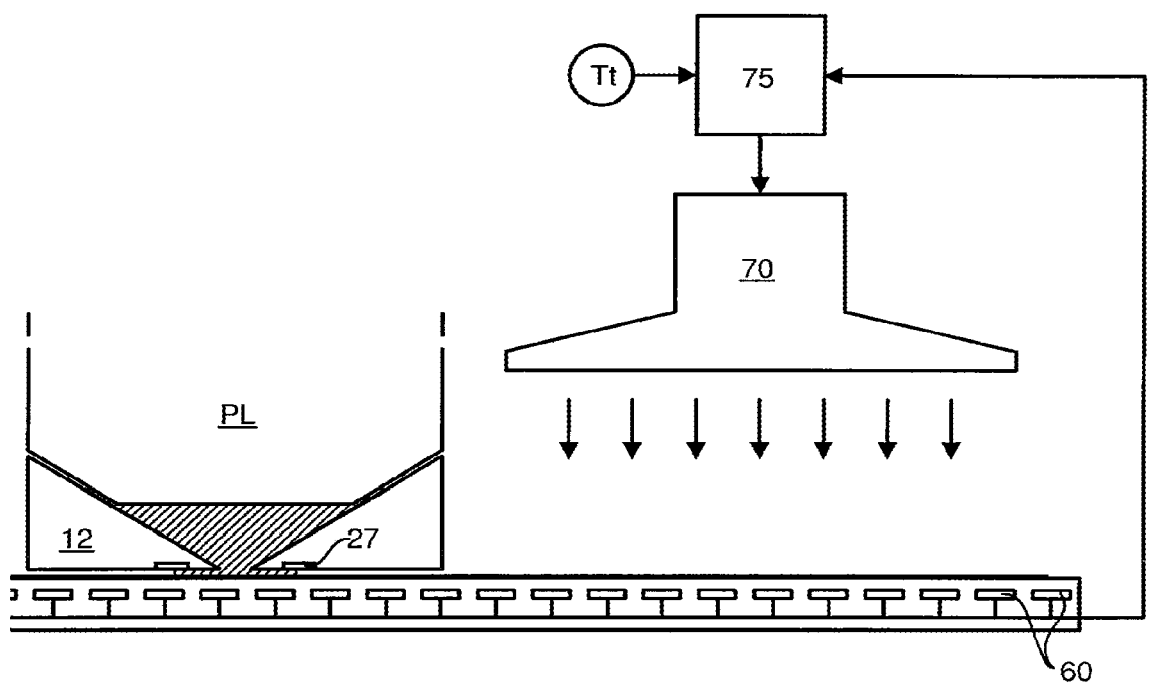
FIG. 6 depicts a barrier member, gas-shower outlet and gas-shower outlet controller according to an embodiment of the invention.

Adjusting the humidity of the gas supplied to the gas seal 27 may be most efficient for cooling caused by evaporation in the region of the gas seal 27, particularly around the vacuum exhaust inlet 18 and vacuum exhaust pipe 14. In an embodiment, it is desirable to have an additional mechanism to control the net evaporation of liquid beyond the gas seal 27 and outside of the barrier member 12. Such an arrangement, according to an embodiment of the invention, is illustrated in FIG. 6. Here, a gas-shower outlet 70 is provided that is capable of providing a flow of gas with a relative humidity controlled to be greater than 10%. A gas-shower humidity controller 75 is provided that is capable of adjusting the relative humidity in accordance either with calibration measurements, calculations or measurements of the temperature at one or various points on the substrate W and/or substrate table/substrate holder, as provided by one or more temperature sensors 60, and comparing them with a target temperature or temperatures Tt. A desired range of relative humidity in this case is about 40 to about 50%. In the case where the gas-shower humidity controller 75 is arranged to respond to temperature measurements, it may adjust the relative humidity of the gas in order to reduce a difference or differences between the measured and target temperature(s) Tt. That is to say, where a single temperature sensor 60 is present, the gas-shower humidity controller 75 compares this one temperature reading with a single target temperature Tt. Where a plurality of temperature sensors 60 are present, the gas-shower humidity controller 75 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used). A feedback controller, such as a PID system, may control the efficiency of the process.

The gas-shower humidity controller 75 may be arranged to interact with the pressurized gas humidity controller 50 so as to ensure that the relative humidity of the gases provided by the gas seal 27 and the gas-shower outlet 70 are matched. This feature provides a mechanism by which variations in the relative humidity outside of the gas seal 27 may be controlled and avoids disturbances to systems, such as the interferometers used to measure the position of the substrate table WT, that might otherwise occur.

The substrate table WT is normally arranged to be moved relative to the projection system PL and barrier member 12 by a substrate table displacement system 100 (see FIG. 8), so that consecutive target regions of the substrate W may be exposed by the patterned radiation beam. This process may encourage small quantities of immersion liquid to leave the confines of the immersion reservoir 25 in spite of the operation of the gas seal 27. Embodiments arranged to reduce component cooling caused by reducing immersion liquid evaporation have been discussed above. According to an alternative aspect of the invention, errors caused by the cooling effects of evaporating immersion liquid may be reduced by providing a substrate heater, configured to heat at least a portion of the substrate W according to the position, velocity, acceleration, or predetermined path of the substrate table WT relative to the barrier member 12, the local substrate W, the substrate table WT temperature, or any combination thereof. The substrate heater may provide heating via a number of mechanisms. These may include: an infra-red emission source, a glow wire electrical resistance heater, a hot gas jet, or any combination thereof. Factors when deciding which kind of heater to use may include how finely and quickly the heating power needs to be adjusted, as well as how effectively the heater can be produced in miniature form. The latter factor may become more or less important depending on whether the heater needs to be embedded in or near the material whose temperature it is intended to regulate (such as a glow wire, for example, embedded in the substrate table WT), or whether the heater works to some extent at a distance (such as a radiation-emitting source or temperature-controlled gas jet source). In the case of a radiation-emitting source, the wavelength distribution of the radiation should be chosen so as not to react with resist compositions on the substrate W (infra-red radiation would be safe in this regard for most resists of interest). Selection of radiation intensity will depend on the optical properties of the resist (such as its reflectivity). This may be determined by calibration measurements during a set-up sequence of the lithography apparatus. Where there is likely to be a process stage dependency (due to variations in the reflectivity, for example), calibration may also be carried out within the production sequence as an extra measurement phase for each lot of substrates. As shall be described below, several embodiments of the invention operate on the principle that at least a subset of the substrate heaters present are actuated during a substrate exposure sequence, i.e. as the barrier member 12 passes over the substrate W. However, a system that heats the substrate W before exposure, so as to compensate for cooling that has yet to occur but is expected to occur, also falls within the scope of the invention.

Figure 7:
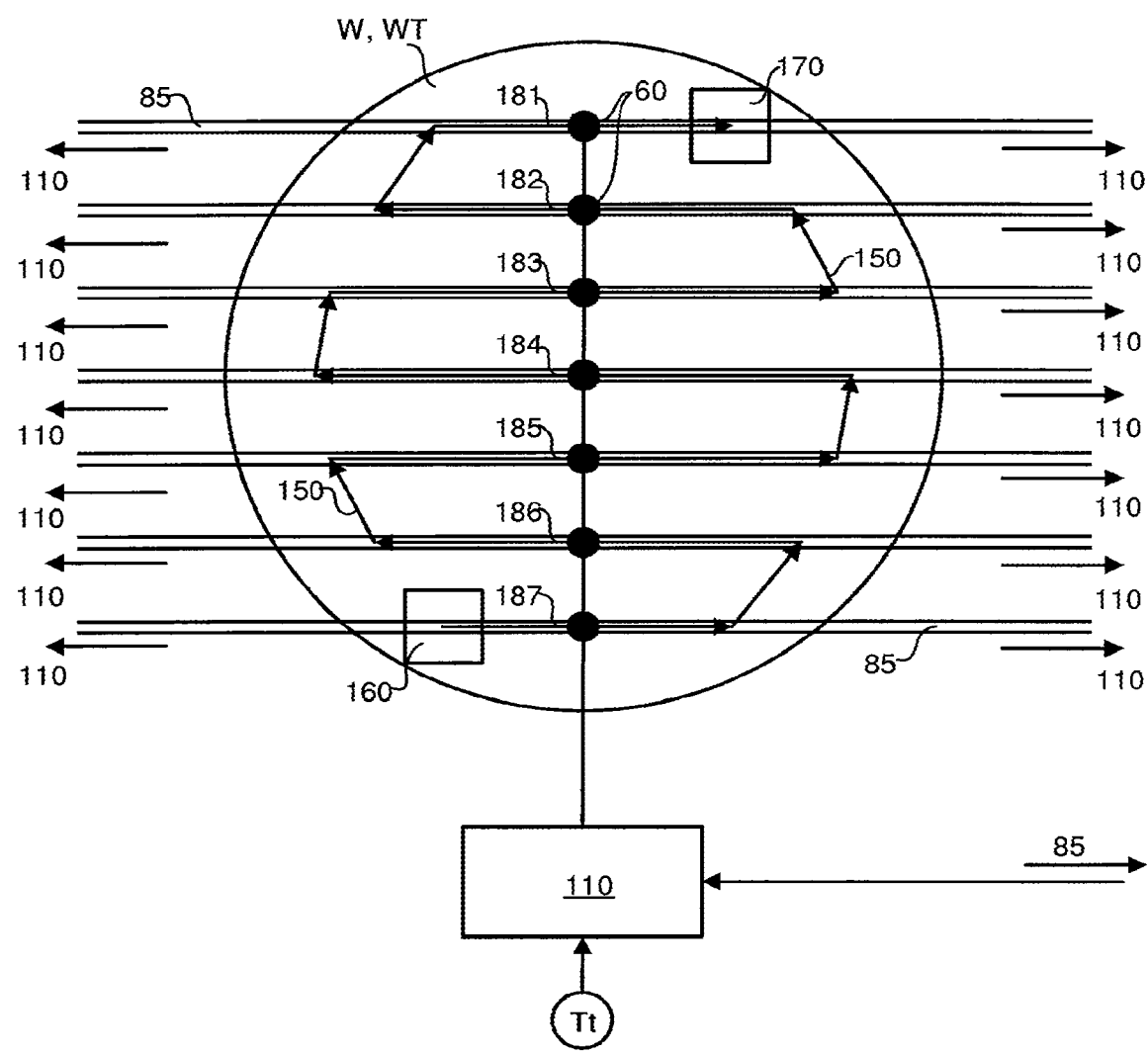
FIG. 7 depicts a top view of a substrate table comprising a system of local heaters and a substrate temperature controller according to an embodiment of the invention.
Figure 8:
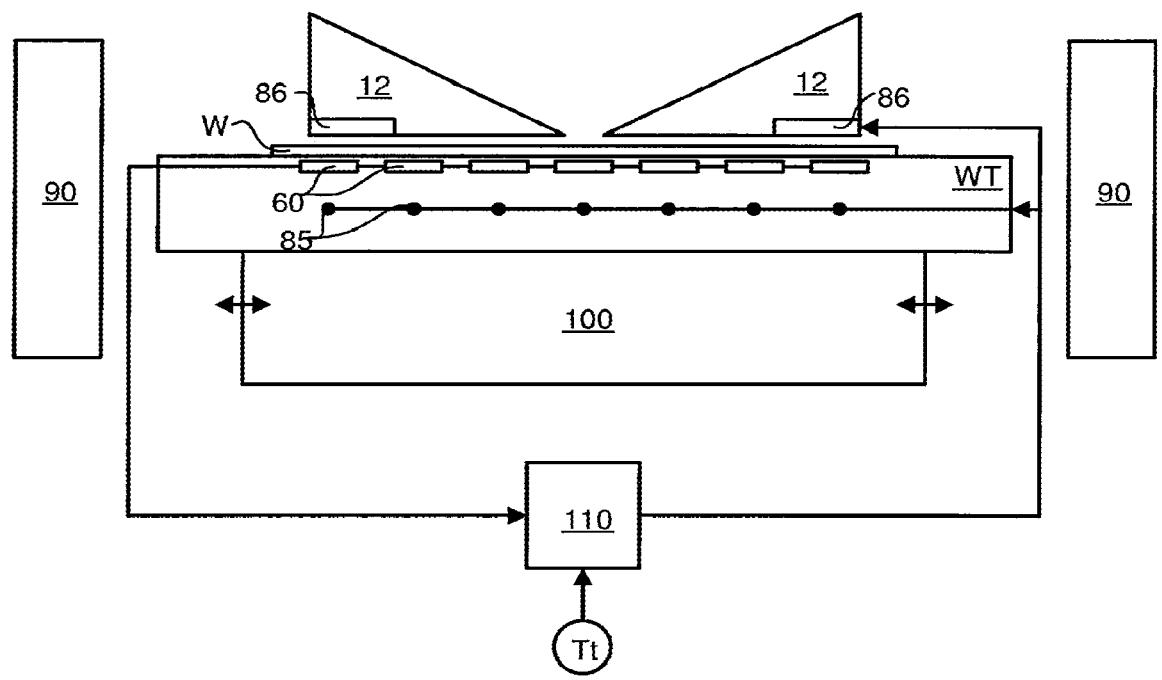
FIG. 8 depicts a side view of the substrate table of FIG. 7, showing also a plurality of temperature sensors, a substrate table path determining device and substrate heaters located in the barrier member.

FIGS. 7 and 8 show an arrangement according to an embodiment of the invention, comprising a system of heaters 85,86 embedded either in the substrate table as "local heaters" 85, or in the barrier member 12 as "remote heaters" 86, or both. The local heaters 85 are each arranged to heat predominantly a particular region of the substrate W and together may be used to control the temperature profile of at least a portion of the substrate W. The remote heaters 86 will heat a different portion of the substrate W depending on the position of the barrier member 12 relative to the substrate W.

According to a first mode of operation involving the local heaters 85, the heating power and relative timing of each heater may be adjusted to set up a starting temperature profile for the substrate W at a known period of time before the substrate exposure cycle is started. By reference to calibration measurements and/or analysis of test patterns generated by the lithographic apparatus, a starting temperature profile may be selected that substantially compensates for cooling that will occur due to evaporation of immersion liquid during the exposure cycle.

According to a second mode of operation involving the local heaters 85, each of these heaters 85 may be arranged to be switched to a heat-emitting state only when the barrier member 12 passes over the region that they are positioned to heat. For example, in the case where the barrier member 12 (and thus the target area) moves relative to the substrate W as shown in FIG. 7, along a path 150 between an initial die (or target area) 160 to a final die 170, the local heaters 85 would also be switched on in a progressive manner substantially along the same path 150. This may be achieved by programming a substrate temperature controller 110 to provide a series of time-delayed actuation signals that for each local heater 85 closely lags behind the intended path of the barrier member 12 relative to the substrate table WT. The intended path may be stored in a substrate table path determining device 90. As an alternative or additional approach, the actuation sequence of the local heaters 85 may be derived from further functions of the substrate table path determining device 90. For example, the substrate table path determining device 90 may comprise a device (based on interferometry, for example) to measure the position, velocity and/or acceleration of the substrate table WT and to feed this information to the substrate temperature controller 110, which may be configured to calculate at this point when to activate each local heater 85. For example, the path determining device 90 may be configured to send an actuation signal to a given heater when it detects that the barrier member 12 is moving away from, or moved past, that particular heater. The power supplied by each local heater 85 may be arranged to be constant or time-varying and be the same as or different to the other local heaters 85. The optimal arrangement to use for each heater is that which best compensates the power lost due to evaporation for the region concerned. In the case where the rate of loss of liquid from the barrier member 12 is constant, the power to be supplied by each heater 85 once activated may be substantially the same (because once the barrier member 12 has passed by, the amount of liquid left behind on the substrate W to evaporate may be found to be roughly constant). Alternatively, more heating power may be required in certain regions, such as where the barrier member 12 changes direction relative to the substrate table WT. Calibration measurements may be carried out to determine the most effective way to operate the heater powers as a function of the particular substrate table path and rate required.

The remote heaters 86 in the barrier member 12 may, in an embodiment, be positioned around the periphery of the barrier member 12, as shown in FIG. 8. This arrangement allows the heaters to operate in close proximity to the region where the evaporation processes may be extracting the most heat. Placement near the outer diameter may be chosen as a compromise to avoid the region immediately around the gas seal 27, which in practice is already heavily occupied by holes, pipes and ducts. Because they operate at a distance from the substrate W, heater mechanisms such as those based on radiation or hot gas jets may be appropriate. Creating a hot surface in the base of the barrier member 12 is one method by which a radiation source may be implemented. Thermal isolation of such a device from the rest of the barrier member 12 may improve the performance of such a feature. Alternatively or additionally, infra-red bulbs may be used.

As was arranged for the local heaters 85 above, the power of the remote heaters 86 may be controlled depending on the direction of motion of the substrate table. For example, it may be arranged to provide more heat from one side of the barrier member 12 than from the other. As one aspect of the cooling is related to evaporation of liquid escaping from the barrier member 12, the remote heaters 86 on the trailing edge of the barrier member 12 (where immersion liquid is likely to be escaping) may be configured to emit a higher heating power than those located on the front edge of the barrier member 12 (where the substrate W is still dry). The effectiveness of the remote heaters 86 may be varied on demand by varying the power and/or width of the heaters 86 around the circumference of the barrier member 12. This latter parameter may be varied, for example, by progressively activating different segments of a segmented heater 86, or one heater 86 of a plurality of heaters 86.

Although shown embedded in the substrate table WT or barrier member 12, it is to be understood that the heaters 85,86 may be positioned anywhere where they can influence the temperature of the substrate W. Radiation-emitting heaters, for example, may be positioned in a separate body distinct from the substrate table WT and barrier member 12. Where the substrate W is heated prior to exposure, this may occur in a region away from that used for exposure, so as to implement more easily the remote heaters 86.

The lithographic apparatus may also comprise local temperature sensors 60, which in the example illustrated in FIG. 8 are embedded in the substrate table WT. According to an embodiment of the invention, these temperature sensors 60 are arranged to measure the temperature of each region of the substrate W and/or corresponding region of the substrate table/substrate holder affected by each local heater 85. This information is fed to the substrate temperature controller 110, which may then calculate how to control the output of the local heaters 85 and/or remote heaters 86 so as to reduce a difference between a target temperature or temperatures Tt and the temperatures measured by the local temperature sensors 60. In this embodiment, it may be desirable to arrange for the heaters 85 and/or 86 to have a variable rather than fixed output. In either case, a feedback controller (such as PID) may be used to optimize the efficiency of the convergence process.

Modulating the temperature of the liquid supplied by the liquid supply system 130 may also control the temperature of the substrate W and/or substrate table/substrate holder. For example, the immersion liquid may be heated to a controlled temperature greater than 295 K. FIG. 5 shows an embodiment of the invention comprising an immersion liquid temperature controller 120 arranged to carry out this function in cooperation with the liquid supply system 130. The temperature control of the immersion liquid may be effected with reference to calibration measurements or with reference to readings from one or more temperature sensors 60 in order to select an immersion liquid temperature that will compensate effectively for evaporation heat loss. In the latter case, the output of the immersion liquid temperature controller 120 may be controlled so as to minimize a difference or differences between a target temperature or temperatures Tt and the temperature(s) provided by the temperature sensor(s) 60, the convergence process being controlled by a feedback controller, such as a PID controller. That is to say, where a single temperature sensor 60 is present, the immersion liquid temperature controller 120 compares this one temperature reading with a single target temperature Tt. Where a plurality of temperature sensors 60 are present, the immersion liquid temperature controller 120 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used).

Modulating the temperature of the gas supplied by the pressurized gas supply system 30 may also control the temperature of the substrate W and/or substrate table/substrate holder. For example, the pressurized gas may be heated to a controlled temperature greater than about 300 K. The lower temperature limit here is higher than that required for the immersion liquid temperature controller 120 described above due to the lower heat capacity of the gas relative to the liquid. According to one embodiment of the invention, pressurized gas is provided at temperatures in the range of about 300 to about 320 K. FIG. 5 shows an embodiment of the invention comprising a pressurized gas temperature controller 140 arranged to carry out the temperature control function in cooperation with the pressurized gas supply system 30. The temperature control of the pressurized gas may be effected with reference to calibration measurements or with reference to readings from one or more temperature sensors 60. In the latter case, the output of the pressurized gas temperature controller 140 may be controlled so as to minimize a difference or differences between a target temperature or temperatures Tt and the temperature(s) provided by the temperature sensors 60, the convergence process being controlled by a feedback controller, such as a PID controller. That is to say, where a single temperature sensor 60 is present, the pressurized gas temperature controller 140 compares this one temperature reading with a single target temperature Tt. Where a plurality of temperature sensors 60 are present, the pressurized gas temperature controller 140 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used).

As has already been discussed, the substrate heating requirements have a positional dependence that may be at least in part determined by the path of the barrier member 12 over the substrate W. At least two processes have been identified as contributing to the cooling process: evaporation of liquid in the gap 22 between the substrate W and the barrier member 12, and evaporation of residual liquid left on the substrate W after exposure, if the exposed area is left wet. The cooling power of the barrier member 12 (i.e. cooling from the first process) is constant in time although it depends, inter alia, on the velocity of the barrier member 12 relative to the substrate W. The cooling power of the second process depends, inter alia, on the amount of liquid left on the substrate W. The amount of cooling that needs to be compensated is in general a complex function of both processes, leading to a cooling power with a complex positional dependence. Thermal conduction within the substrate W will also be a factor, meaning that unexposed areas of the substrate W may start to cool even before the barrier member 12 reaches them due to cooling in exposed portions of the substrate W. Taking one process at a time, however, it is possible to make some estimations. For example, considering only the direct cooling from evaporation of residual immersion liquid on the substrate W, a substrate exposure configured to take about 30 seconds, with a time between a last exposure and substrate unloading of about 5 seconds, and an exposure sequence such as that labeled 150 in FIG. 7, about 20% to about 30% more heat may be expected to be extracted by this mechanism at the location 160 of the first exposure than at location 170 of the last exposure. In certain embodiments described above comprising substrate heaters 85,86, this effect was taken into account by delaying the action of individual heaters along the path of the barrier member 12. A similar effect may also be achieved by configuring the substrate heater to provide a higher heating power at target regions on the substrate W where the projection system is configured to project the patterned radiation beam at a first time and provide progressively lower heating powers at target regions on the substrate W where the projection system PL is configured to project the patterned radiation beam at later times. This arrangement may be varied to give a more complex position-dependent heating depending on the cooling characteristics of a particular setup that have to be compensated.

Although it may be technically possible to position a large number of local heaters 85 at many different locations on the substrate W, it is, in practice, almost as effective and significantly less expensive to provide a more limited number of heaters and position them to substantially follow the path of the barrier member 12. An arrangement of this type is depicted in FIG. 7. Here, elongate substrate heaters 85, such as glow wires, are arranged so that one individually controllable element is aligned with one of the principal scanning or stepping axes 181-187 (each corresponding to a row of dies) of the barrier member 12 over the substrate W. In the example shown, each glow wire 85 is arranged to emit a constant heating power per unit length and is configured so that the glow wire aligned with the principal scanning or stepping axis 187 has the highest heating power, that aligned with 186 the next highest heating power and so on, progressively decreasing until the final glow wire, corresponding to principal scanning or stepping axis 181, is reached, which is assigned the lowest heating power.

Where a large number of local heaters are provided at different locations (for example, between 100 and 700 per substrate), it is desirable to position the heaters as close as possible to the surface of the substrate W. In the arrangement shown in FIGS. 7 and 8, however, where fewer heaters are provided, it is desirable to position the heaters substantially further away so that each heater may have effective control over a larger portion of the substrate W.

Figure 9:
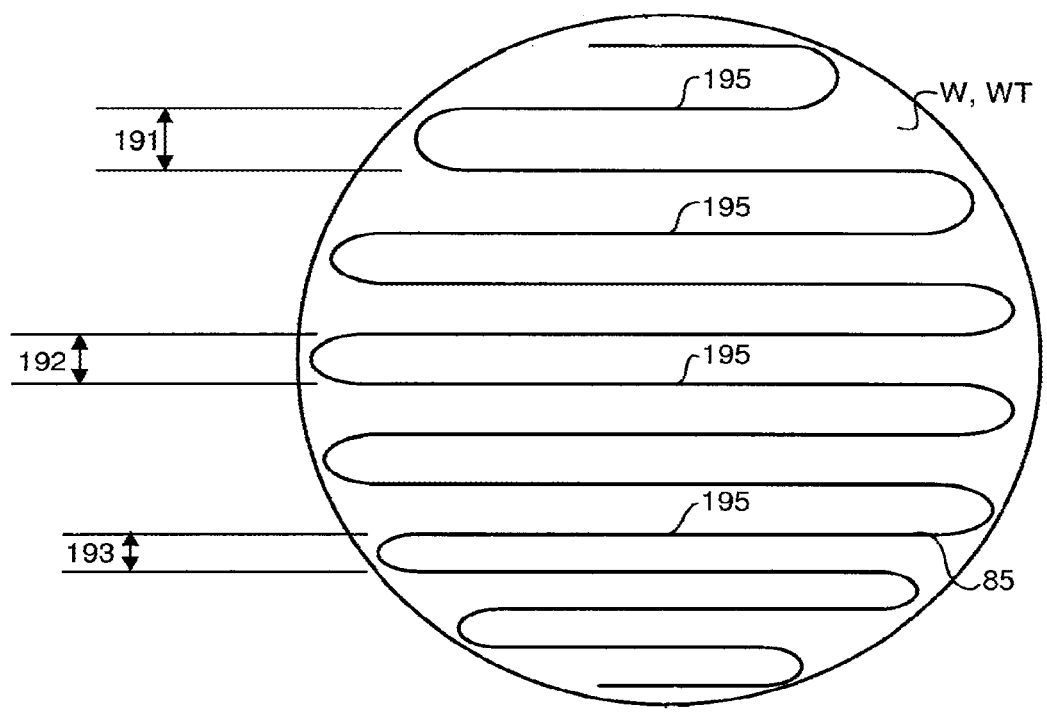
FIG. 9 depicts a top view of a substrate table showing the geometry of a substrate heater arranged to dissipate more power in the lower region of the substrate table than in the upper region.

FIG. 9 shows an arrangement wherein a continuous glow wire heater 85 is provided to heat the substrate W. In the example shown, the glow wire heater 85 is arranged to follow the path of the barrier member 12 to some extent in that it has longer sections 195 substantially parallel to the principal scanning axes 181-187 (i.e. perpendicular to the scanning direction) of the barrier member 12 (as shown in FIG. 7). However, the pitch 191-193 between these longer sections is arranged to become shorter and shorter towards the lower end of the substrate W as depicted, which corresponds to the region within which the substrate W will be first exposed (i.e. pitch 191>pitch 192>pitch 193). This means that the glow wire heater 85 may be given the simplest and most robust construction (that where the heating power is constant per unit length, which in practice may correspond to an elongate resistive element of constant cross-section) and yet still provide a heating power that is larger towards the region within which the substrate W will be first exposed, which is the region of the substrate W that will require the largest correction for cooling effects. As an alternative and/or additional arrangement, the glow wire heater 85 may be arranged to provide a heating power per unit length that varies along its length (for example, increasing towards the lower end of the substrate W in the orientation depicted). In the case where the glow wire operates by means of electrical dissipation associated with an electric current passed along its length, variable heating power may be achieved either by varying the cross-section (for example, providing a glow wire that becomes thinner where more power is needed) or by varying the material used. In the latter arrangement, care should be taken to avoid points of high resistance where junctions are made between materials of different composition.

Figure 10:
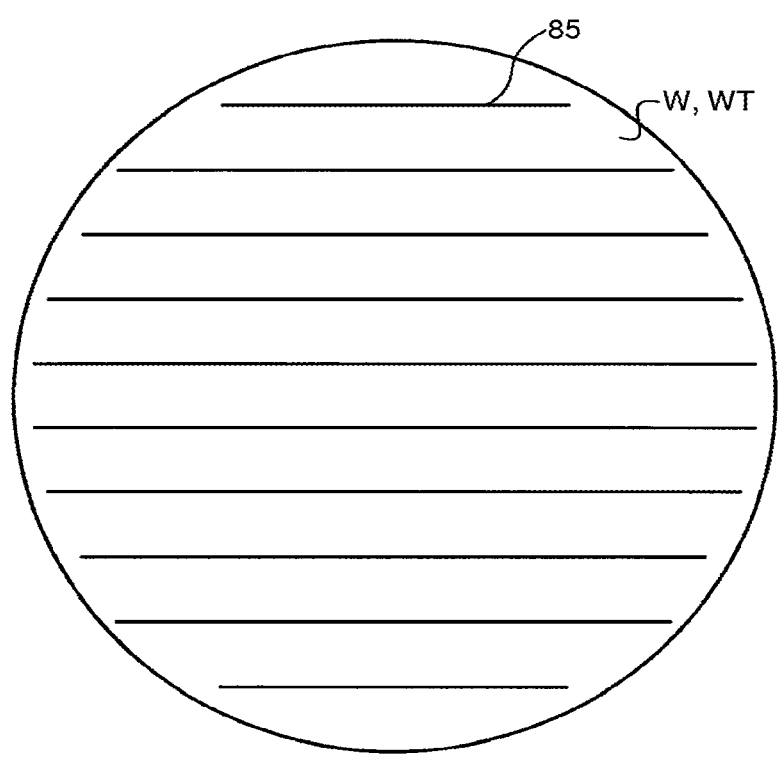
FIG. 10 depicts an array of individually controllable substrate heaters according to an embodiment of the invention.
Figure 11:
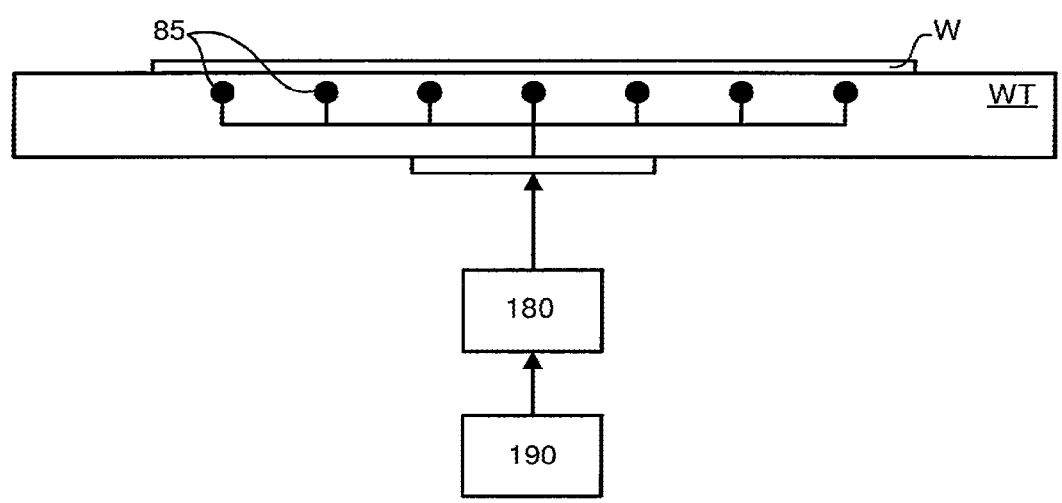
FIG. 11 depicts a side view of the arrangement of FIG. 10, showing also interaction with a heater array controller and predetermined algorithm input device.

FIGS. 10 and 11 show an arrangement wherein the substrate heater comprises a system of individually controllable heaters 85. In the embodiment shown in FIG. 10, the individually controllable heaters 85 are arranged as elongate members substantially parallel to the principal scanning axes 181-187 (i.e. perpendicular to the scanning direction) and confined to heat within the geometrical limits of the substrate W. However, alternative arrangements of heaters would also be compatible with this embodiment of the invention as long as they may be controlled individually. A heater array controller 180 controls each individually controllable heater 85 via an address bus. The heater array controller 180 receives in turn input from a predetermined algorithm 190, which describes how the heating power of each individual heater should be controlled as a function of time (and therefore as a function of the position of the barrier member 12 relative to the individual heater in question). The appropriate algorithm to use may be derived from calibration measurements and/or calculation (based, for example, on the amount of time an expected amount of liquid is expected to remain on the substrate W). This approach has the advantage of not requiring temperature sensors, which may greatly simplify construction.

Evaporation of immersion liquid may also lead to cooling of the barrier member 12 itself. This effect may lead in turn to cooling of the substrate W, for example, by cooling the immersion liquid and/or pressurized gas by convection and/or by radiative effects. According to an aspect of the invention, a barrier member temperature stabilizer is provided to reduce cooling of the substrate W by this mechanism.

Figure 12:
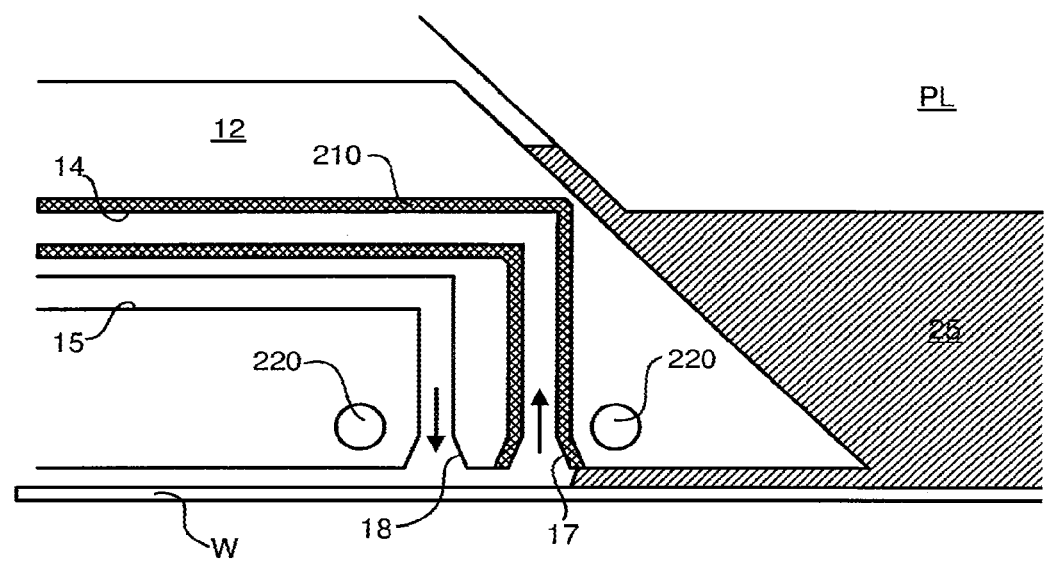
FIG. 12 depicts a partial view of a barrier member according to an embodiment of the invention, showing a thermal isolation sleeve for a vacuum exhaust inlet and vacuum exhaust pipe and a barrier member heater.

A region of particular concern is around the vacuum exhaust inlet 17 and in the vacuum exhaust pipe 14, as shown in FIG. 12. Where immersion liquid is present in these regions, net evaporation may be particularly pronounced, as the concentration of vapor may be kept low by the vacuum system (evaporated liquid will immediately be pumped away). One way in which overall cooling of the barrier member 12 due to this mechanism may be controlled is illustrated in FIG. 12, where the barrier member temperature stabilizer is effected by means of a thermal isolation sleeve 210 arranged around the vacuum exhaust pipe 14. In an embodiment, the thermal isolation sleeve 210 should be formed from a material having very low thermal conductivity at the expected operating temperature of the lithographic apparatus. General purpose plastics, PTFE, etc. may be appropriate materials for the thermal isolation sleeve 210. Alternatively or additionally, the barrier member itself may be constructed wholly or partially of a thermally isolating material. This approach may be more effective and more easily implemented than having only a thermal isolation sleeve 210, although the choice of materials with suitable mechanical characteristics may be restricted.

An additional and/or alternative approach is to provide a dedicated barrier member heater 220, which is arranged to provide a compensating heating power to those areas of the barrier member 12 cooled by evaporation of the immersion liquid. Although directed on the one hand to heating the barrier member 12 itself, and thus, indirectly, the substrate W, the barrier member heater 220 may be arranged to heat the substrate W directly. This may be achieved through the use of a radiation-emitting heater such as an infra-red heater, which has been described above in the context of possible substrate heaters 85,86. In the arrangement shown in FIG.

12, the barrier member heaters 220 are arranged around the vacuum exhaust inlet 17 and may follow the geometry of the vacuum exhaust inlet in a plane perpendicular to the axis of the barrier member 12 (into the page in the orientation depicted).

The heating power of the barrier member heater 220 may be controlled by the barrier member temperature stabilizer according to input from one or more of a number of possible sources. For example, the barrier member heater power may be adjusted in response to the flow rate in the vacuum exhaust pipe 14, which may be provided by the pressurized gas supply system 30. Here, it is expected that a higher heating power may be required for higher flow rates.

The barrier member heater 220 may also be controlled by reference to the temperature of the substrate W and/or substrate table/substrate holder, which may be measured at one or more positions by one or more temperature sensors 60. As with previous embodiments, a feedback controller may be employed to reduce a difference between the measured substrate temperature(s) and one or more predefined target temperatures Tt.

Figure 13:
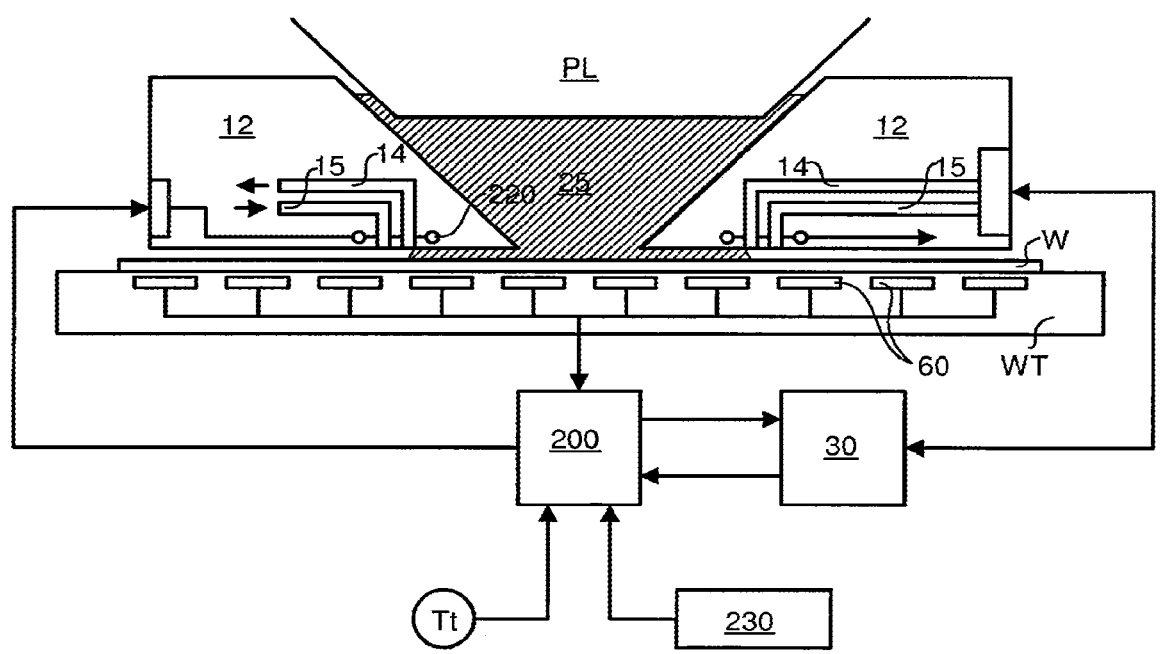
FIG. 13 depicts interaction between a barrier member and barrier member temperature stabilizer according to an embodiment of the invention.

The barrier member heater 220 may also be controlled in response to the relative humidity of the gas supplied by the pressurized gas outlet 18. This information may be provided by humidity sensors, which may be arranged either in the barrier member 12 or as part of the pressurized gas supply system 30 (the latter case being illustrated in FIG. 13).

Finally, the barrier member temperature stabilizer 200 may control the output of the barrier member heater 220 by reference to a calibration table 230 of required corrections, constructed from measurements of the barrier member temperature as a function of: substrate temperature, pressurized gas flow rate, pressurized gas flow temperature, vacuum exhaust flow rate, vacuum exhaust temperature, pressurized gas relative humidity, immersion liquid temperature, or any combination thereof. Although calibration measurements should be undertaken, this approach greatly reduces the need to incorporate additional functional components in the final lithographic apparatus to be shipped to the customer.

Figure 14:
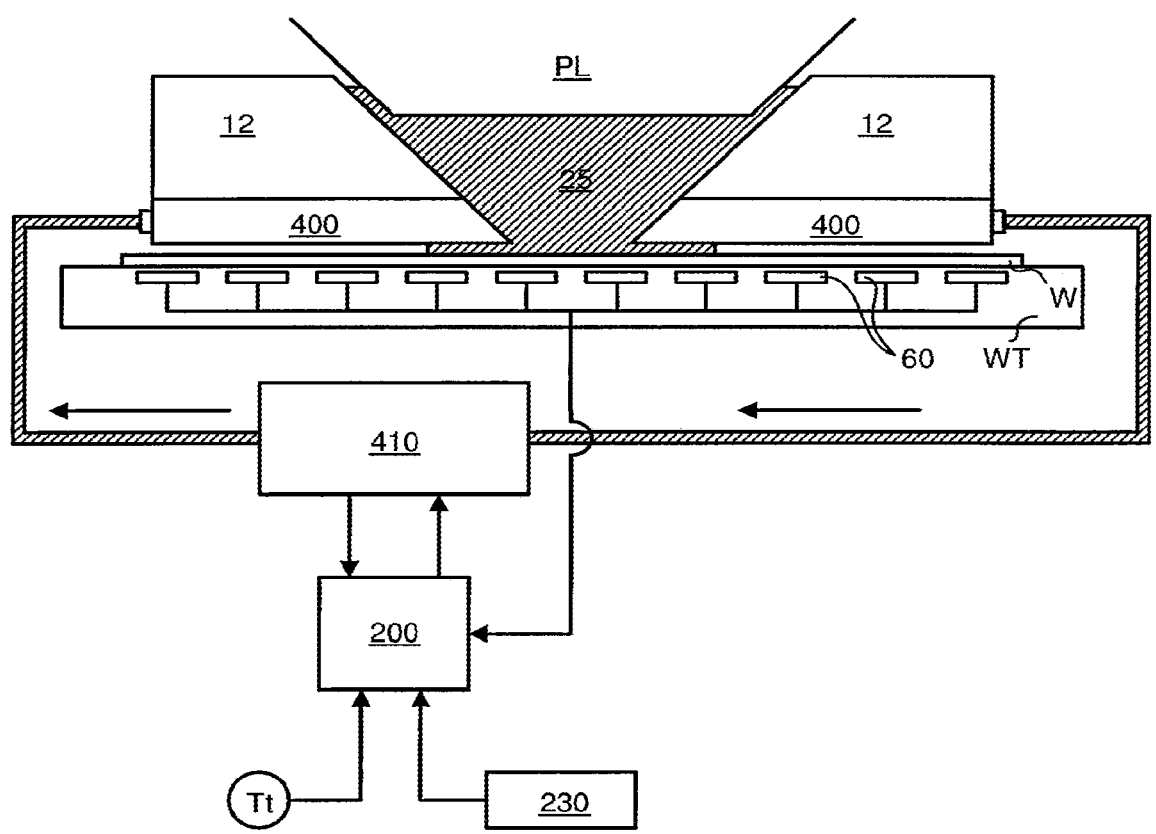
FIG. 14 depicts a barrier member comprising a network of fluid-carrying channels and a fluid supply system according to an embodiment of the invention.
Figure 15:
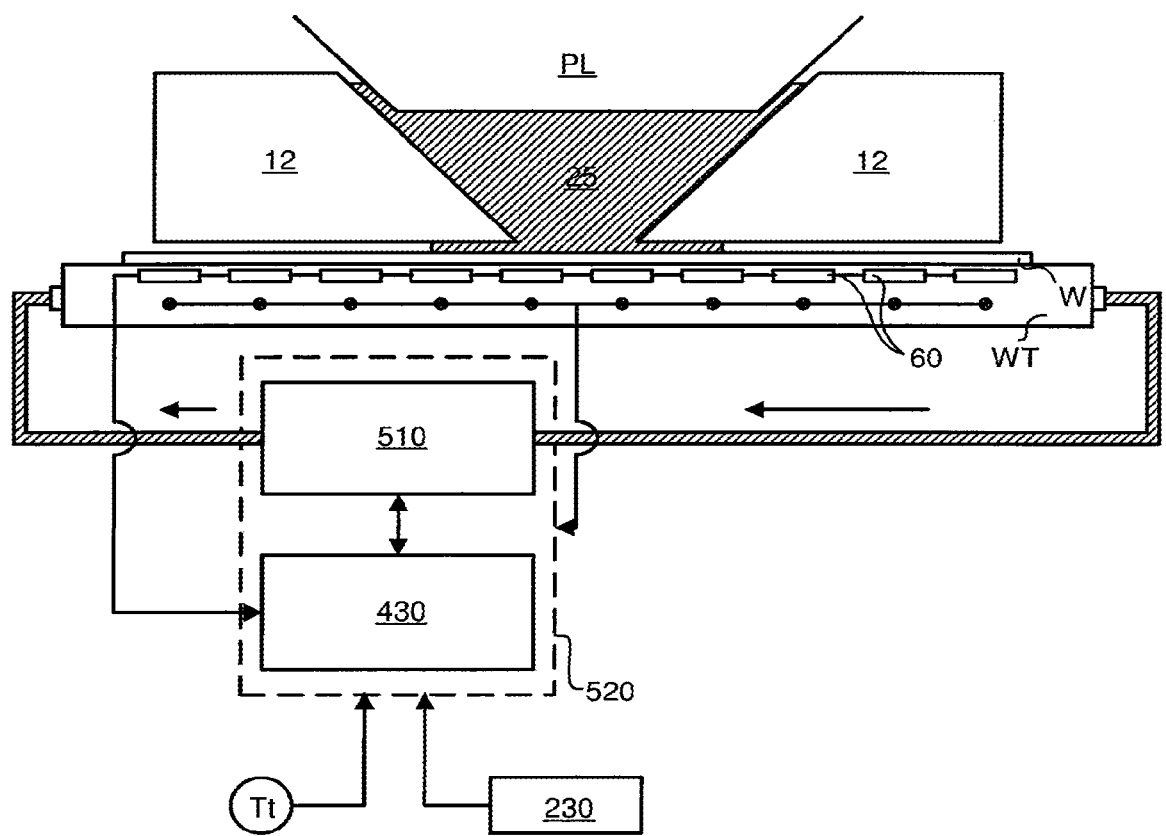
FIG. 15 depicts a barrier member and substrate table comprising a network of fluid-carrying channels and an array of individually controllable heaters controlled by a substrate temperature controller comprising a substrate table heat-exchange fluid controller and a substrate heater controller.

When considering the problem of substrate cooling linked to a cooled barrier member 12, an important region of the barrier member 12 is that closest to and/or facing the substrate W. According to an embodiment of the invention depicted in FIG. 14, the barrier member 12 is constructed with a network of channels distributed in a layer 400 in the portion of the barrier member 12 closest the substrate W. The barrier member temperature stabilizer 200 is configured to control a heat-exchange fluid supply system 410 that provides a heat-exchange fluid to the network at a controlled temperature and/or flow rate. As in previous embodiments, a feedback controller may be provided to help control the substrate temperature in an efficient manner. In this case, the temperature and/or flow rate of the heat-exchange fluid provided by the fluid supply system 400 may be adjusted so as to reduce a difference between one or more substrate temperatures and/or substrate table temperatures, as measured by a system of local temperature sensors 60, and a target temperature or temperatures Tt. That is to say, where a single temperature sensor 60 is present, the fluid supply system 400 compares this one temperature reading with a single target temperature Tt Where a plurality of temperature sensors 60 are present, the fluid supply system 400 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used). The temperature and/or flow rate of the fluid may also be controlled by reference to a calibration table 230 of required corrections, constructed from measurements of the barrier member temperature as a function of: substrate temperature, pressurized gas flow rate, pressurized gas flow temperature, vacuum exhaust flow rate, vacuum exhaust temperature, pressurized gas relative humidity, immersion liquid temperature, or any combination thereof. Although calibration measurements should be undertaken, this approach greatly reduces the need to incorporate additional functional components in the final lithographic apparatus to be shipped to the customer.

A general advantage of those embodiments described above that depend on mechanisms located in the barrier member 12 is that they may be implemented without influencing the dynamic performance of the substrate table WT (this may be true both for fluid-based and electrical systems). Barrier member temperature conditioning also improves not only short-term (die to die) temperature variations in the substrate W, but also long-term temperature variations from one substrate W to the next. More generally, the development costs (and development time) associated with barrier member improvements are likely to be significantly lower than those involving the substrate table WT. Apart from the problems associated with controlling the dynamics of the substrate table WT, a further factor in favor of working on the barrier member 12 rather than the substrate table WT relates to the flatness requirements, which are approximately 100 times more relaxed for the barrier member 12. This may be important, for example, where channels are machined into the barrier member 12. Introducing holes near the surface (where they are most effective) tends to introduce surface irregularities (bulges) as might variations in the pressure of the heat-exchange fluid (due to the reduced stiffness of the thin width of material left between the outer surface of the barrier member and the internal channel edge.

FIGS. 15 to 18 depict an arrangement also comprising a network of fluid-carrying channels. In this arrangement, the channels are located in the substrate table WT in close proximity to the substrate W. This arrangement of channels is configured to control the temperature of the substrate W, which may be adversely affected by evaporation of immersion liquid from its top surface.

In the present embodiment, a substrate table heat-exchange fluid controller 510 is provided for controlling the temperature and flow rate of a heat-exchange fluid arranged to flow through the network of channels 500.

As in previous embodiments, a feedback controller may be provided to help control the substrate temperature in an efficient manner. In this case, the temperature and/or flow rate of the substrate table heat-exchange fluid may be adjusted so as to reduce a difference between one or more substrate temperatures and/or substrate table/substrate holder temperatures, as measured by a system of local temperature sensors 60, and a target temperature or temperatures Tt.

The arrangement may work particularly effectively if local substrate heaters, such as glow wires, are also included so as to implement a "push-pull" principle of temperature control. According to this embodiment, a substrate temperature controller 520 controls the operation of a substrate heater controller 430 and the substrate table heat-exchange fluid controller 510. A feedback controller may be included as part of the substrate temperature controller 520, arranged to minimize a difference or differences between the substrate temperature, as measured at one or more locations on the substrate W and/or substrate table/substrate holder by local temperature sensors 60, and a target temperature or temperatures Tt. That is to say, where a single temperature sensor 60 is present, the substrate temperature controller 520 compares this one temperature reading with a single target temperature Tt. Where a plurality of temperature sensors 60 are present, the substrate temperature controller 520 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used). Alternatively, a feedforward loop may be used if heat flows can be calculated as a function of the velocity and position of the barrier member 12 relative to the substrate W. According to the "push-pull" principle, the heat-exchange fluid controller 510 may be arranged to provide fluid at a temperature below the target temperature Tt, effectively acting to cool the substrate W. The local substrate heaters, which may be electrical resistance heaters (glow wires) as mentioned above, may respond much more quickly to sudden increases in the evaporation rate than can the heat-exchange fluid controller. Their response speed is additionally improved by being set against the cooling action of the heat-exchange fluid controller. Furthermore, should overshoot of the substrate temperature occur, the provision of the cooling heat-exchange fluid may allow a more rapid return to equilibrium than would be the case if no additional cooling mechanism was provided.

Figure 16:
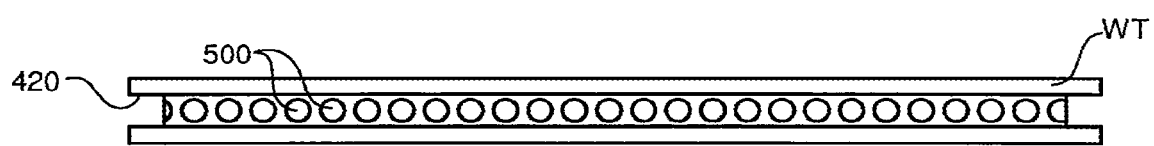
FIG. 16 depicts a substrate table with a network of channels and circular groove according to an embodiment of the invention.
Figure 17:
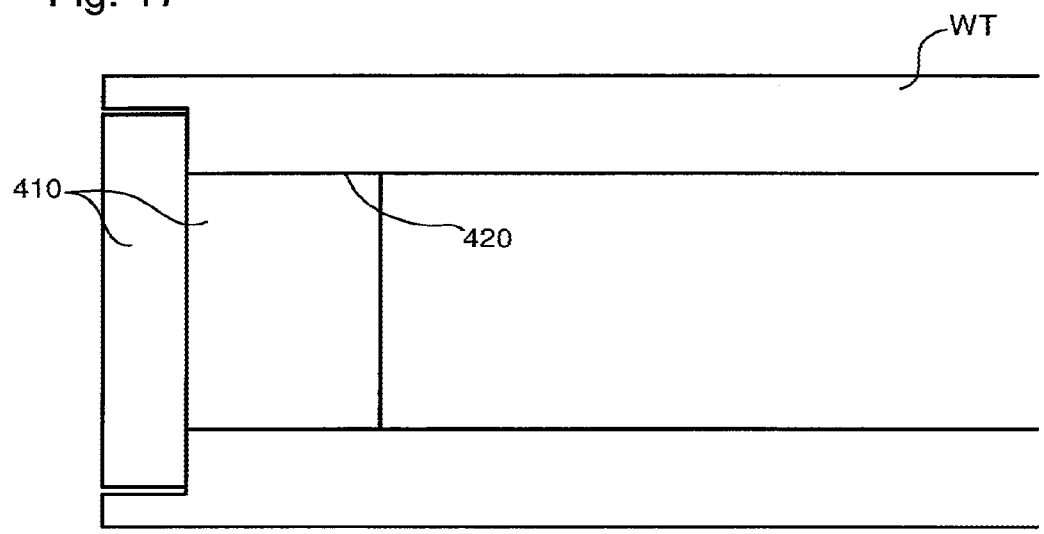
FIGS. 17 and 18 depict the substrate table with circular groove according to FIG. 16, sealed by a sealing ring according to an embodiment of the invention.
Figure 18:
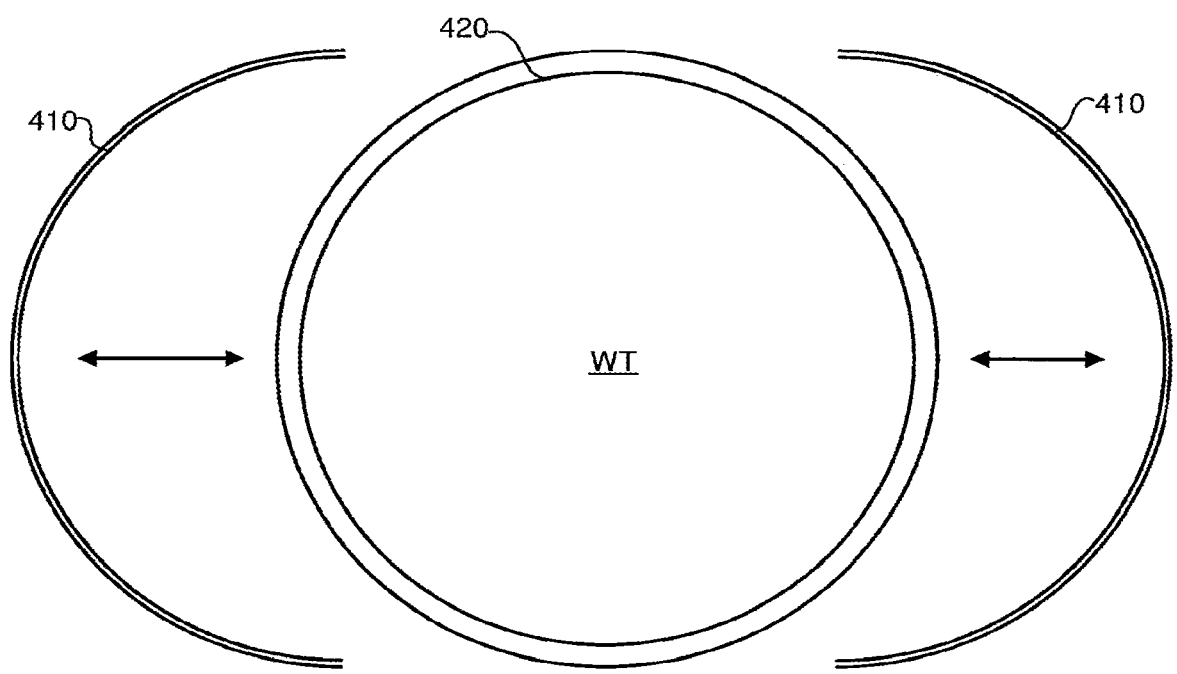

For ease of machining (among other reasons), the network of channels 500 comprise an array of substantially straight holes (which may be drilled) oriented in the plane of the substrate table, as depicted in FIG. 16. The ends of these straight holes should be connected and closed watertight. This may be done with plugs glued in the holes. However, in a typical configuration comprising about 4 mm holes on an about 8 mm pitch, more than 80 plugs may be required. In addition to the problem that many individual elements need to be constructed, the possibility exists in such an arrangement that dead ends occur in which either no fluid arrives at all, or fluid is not circulated. According to an embodiment of the invention, these problems may be overcome by providing a circular groove 420 (shown in FIGS. 16 to 18), at the edge of the substrate table WT into which all through holes can be connected in a neat fashion without dead ends. This arrangement may have a further advantage in that fluid may be made to circulate closer to the edge of the substrate table WT. The circular groove 420 may be sealed using a much smaller number of components. In the embodiment shown, a sealing ring 410 is used, which may be split into two components for ease of assembly and attached to the groove by glue or some other standard bonding technique. The improved fluid distribution provides a more even and controlled cooling for the substrate table WT, allowing more effective thermal management and improved overlay.

Figure 19:
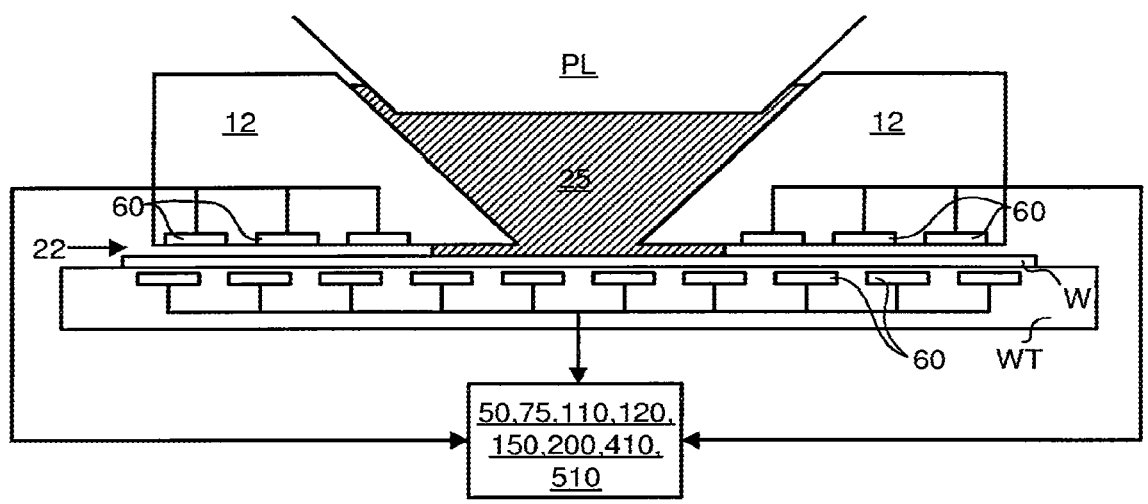
FIG. 19 depicts a lithographic apparatus showing positioning of temperature sensors in the substrate table and barrier member according to an embodiment of the invention.

In the above-described embodiments, local substrate temperature sensors 60, where included, have been shown embedded in the substrate table WT close to the substrate W. These sensors may operate on a variety of principles based generally on the measurement of a calibrated and reproducible temperature-dependent property (such as electrical resistance). Although shown embedded in the substrate, the local sensors may also be positioned in the barrier member 12 as shown in FIG. 19. As the thermal connection is relatively poor across the gap 22 (unlike that between the substrate W and sensors when embedded in the substrate table WT, where a high thermal conductance can more easily be arranged), it is desirable that sensors 60 located in the barrier member 12 operate by analyzing radiation emitted from the substrate W. According to an embodiment of the invention, sensors 60 of this type are provided that comprise a radiation capture and analysis device that is capable of determining an intensity spectrum of captured radiation over a range of wavelengths. In general, the temperature may be determined most accurately if a wide range of wavelengths are chosen. However, for the temperatures of interest in the present application, it is cost-efficient to choose a limited wavelength range encompassing and/or centered on the infra-red radiation band.

Figure 20:
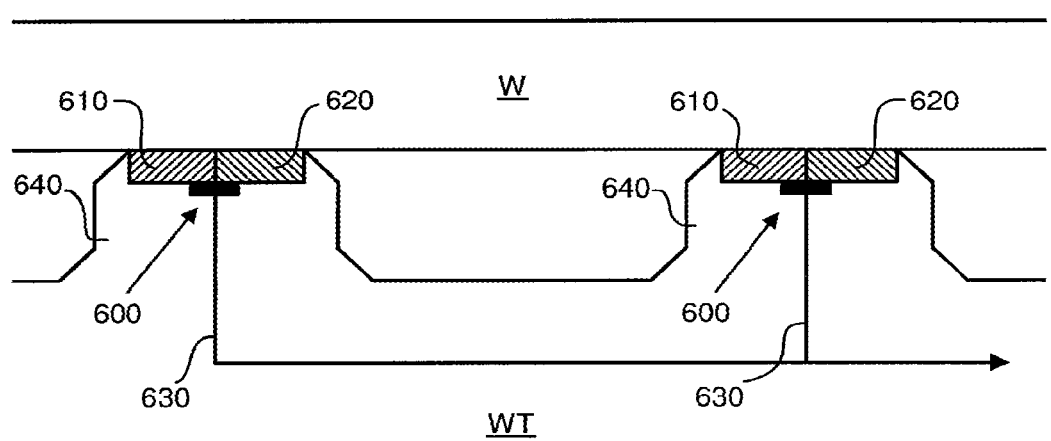
FIG. 20 depicts an enlarged view of the substrate table in the region of the substrate showing an arrangement of miniature temperature control systems according to an embodiment of the invention.

FIG. 20 shows an embodiment of the invention, in which local miniature temperature control systems 600 are built into the substrate table WT. In the example shown, these control systems 600 are positioned near the tips of raised portions of the substrate table WT (burl tops 640), which are in turn in contact with the substrate W. Each miniature control system 600 comprises a miniature temperature sensor 610, which may be realized as a micro-power integrated circuit temperature sensor, and a miniature heater 620, which may be realized as an integrated circuit heater (dissipating heat resistively). The miniature control systems 600 are arranged so that the heater component 620 is activated to emit heat when the local temperature of the substrate, as measured by the miniature temperature sensor 610, falls below a predetermined threshold value. Once the temperature is increased such that it passes again through the threshold value, the miniature control system 600 is configured to switch the miniature heater off. This arrangement may have the advantages of being able to provide highly localized temperature control due to the miniature size of the control systems 600 and also of not needing a separate external control system to control the heaters 620. Only two wires (connection 630) will be required to supply voltage to all of the miniature control systems 600 in the substrate table WT. Construction of the miniature temperature sensors 600 in the burl tops 640 may be carried out by forming the substrate table WT from a silicon wafer. Microfabrication techniques, such as MEMS (Micro-Electro-Mechanical Systems), and CMOS (Complementary Metal Oxide Semiconductor) technologies may be used to provide an exact reproduction of the standard substrate table WT construction, while also adding the integrated-circuit temperature sensor/heater 610/620 on each burl top 640 and providing the means for connecting them electrically to the external world (connection 630).

Figure 21:
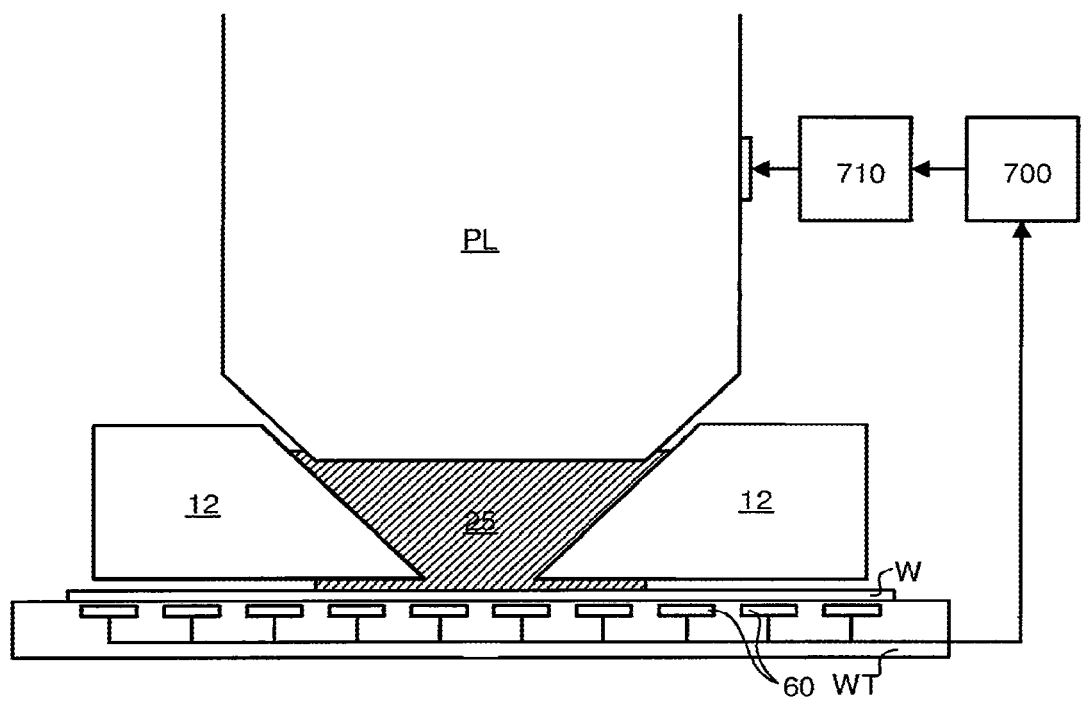
FIG. 21 depicts a projection system controller and thermally-induced-distortion calculator according to an embodiment of the invention.

FIG. 21 depicts an embodiment of the invention comprising a projection system controller 710, configured to adjust the properties of the patterned radiation beam in response to measurements of the substrate and/or substrate table temperatures made by temperature sensors 60. In the embodiment shown, a plurality of temperature sensors 60 are embedded in the substrate table WT. However, it would also be within the scope of the invention to provide temperature sensors elsewhere, such as in the barrier member 12, and/or for only a single temperature sensor to be provided.

As discussed above, the evaporation of immersion liquid on the substrate W may lead to substrate cooling, the resulting distortions possibly leading to overlay errors, defocus, aberration, etc. According to the present embodiment, the projection system controller 710 is capable of adjusting parameters of the patterned projection beam, such as its overall scaling, positional offset etc., so as to compensate for the thermally-induced distortions of the substrate W. As a simple example, if the projection system controller 710 receives input from the temperature sensors 60 indicated that the substrate W is, to a first approximation, uniformly below a target temperature, it may be configured to scale the patterned projection beam by a factor so as to reduce the size of the image generated on the cooled substrate W. Where the temperature of the substrate W and/or substrate table WT is measured by a plurality of temperature sensors 60, such that a temperature profile is obtained, more complex corrections may be implemented by the projection system controller 710 in order to reduce errors such as overlay errors, defocus and aberration. This approach may provide a rapid way for responding to sudden changes in temperature without having to incorporate heating elements in either the barrier member 12 or the substrate table WT, which may be expensive to implement and/or interfere with the dynamic performance of the substrate table WT. This form of compensation may have the added advantage of not being dependent on the particular cooling mechanism at work and may be applicable to situations in which at least a contribution to the change in temperature of the substrate W occurs due to processes other than evaporation of the immersion liquid.

In the embodiment shown in FIG. 21, a thermally-induced-distortion calculator 700 is also provided to translate the readings taken by the temperature sensors 60 to an estimated distortion of the substrate W. This is achieved by first deriving a temperature profile of the substrate W and then using the known thermal properties of the substrate W, such as the thermal expansion coefficient of the substrate material, to calculate the thermally-induced distortion. To a first approximation, the relative distortion of a portion of the substrate W will be proportional to a temperature difference between that of the portion and a reference operating temperature (corresponding to zero relative distortion). In the embodiment shown, the temperature sensors 60 are embedded in the substrate table WT so that additional calculations need to be carried out to derive the substrate temperature profile from the temperature sensor readings. How this may be achieved is described below in relation to this and other embodiments of the invention.

A measure of the temperature of the substrate W may be determined according to several embodiments discussed above by temperature sensors 60 positioned in the substrate table WT. This arrangement may have constructional advantages as there is relatively more space to position the sensors, they may be robustly and accurately positioned, and they may be more easily serviced by whatever electrical connections are required. As discussed earlier, positioning sensors at a distance from the substrate W in the substrate table WT may also provide an effective way to sample a larger area of substrate W per sensor 60. However, it should be understood that while the temperature of the material immediately surrounding the temperature sensor 60 may give an approximate indication of the temperature of the substrate W, it is possible to obtain a more accurate picture of the substrate temperature profile by further analysis, as described below. This analysis may be implemented as part of any of the embodiments described above comprising temperature sensors 60 positioned in the substrate table WT.

Assuming that the heat transport from the substrate surface to the level in the substrate table WT where the temperature sensors 60 are positioned may be described as:

$$T_\infty^{chuck} - T_{current}^{check} = f(\Delta T^{substrate}), \qquad (1)$$

where $T_\infty^{chuck}$ is the initial temperature of the substrate W, $T_{current}^{chuck}$ is the current temperature of a region of the substrate measured by a sensor 60 embedded in the substrate table WT, and $\Delta T^{substrate}$ is the temperature difference at substrate level for the region in question, the temperature of the substrate region, and therefore a temperature profile for the substrate as a whole (if required), may be obtained based on this relationship. For example, the following model may be used:

$$T_\infty^{chuck} - T_{current}^{chuck} = k \cdot e^{-\Delta T_{substrate}/\tau}, \qquad (2)$$

from which it follows that $$\Delta T^{substrate} = -\tau \ln((T_\infty^{chuck} - T_{current}^{chuck})/k), \qquad (3)$$

which provides an expression for the temperature difference at substrate level based only on parameters T and k, which in turn may be estimated from test data.

Similar analyses may be used to derive a better measure of the substrate temperature from infra-red temperature sensor signals. Here, a problem is that silicon (which is frequently used as a substrate material) is significantly transparent to infra-red, so that infra-red sensors positioned in the barrier member 12 "looking down" on the substrate W may receive a mixture of radiation emitted from both the substrate W and the substrate table WT immediately below it.

As mentioned above, as the barrier member 12 moves relative to the substrate W, a thin film of liquid may be left behind on the top surface of the substrate W in the wake of the barrier member 12. If no effective counter measures are taken, evaporation of this liquid may extract heat from the substrate W and/or substrate table WT. The resulting decrease in the temperature of the substrate W and/or substrate table WT may lead to shrinking which may in turn lead to overlay error, general loss of performance/resolution and/or yield loss of the device to be manufactured. Several solutions to this issue have been described above, including providing a net of substrate heating channels and/or an array of independently controlled electrical heaters. However, it may be difficult to coordinate the operation of these heating mechanisms in such a way that heat is only generated where evaporation actually occurs. Therefore, it may be difficult to ensure that temperature gradients within the substrate W are reduced or minimized.

According to an embodiment of the invention, the lithographic apparatus is provided with a device to heat immersion liquid left in the wake of the barrier member 12 using microwave radiation. The frequency of the microwave radiation can be tuned so as predominantly to heat the immersion liquid directly, and not to couple to the surrounding apparatus elements (such as the substrate table WT, substrate W, barrier member 12, etc.). Heating power may therefore be directed precisely to where it is required and temperature gradients may thereby be reduced or minimized. In principle, the heat needed to evaporate the liquid may be completely provided by the microwave source so that no heat is extracted from the substrate W.

Figure 22:
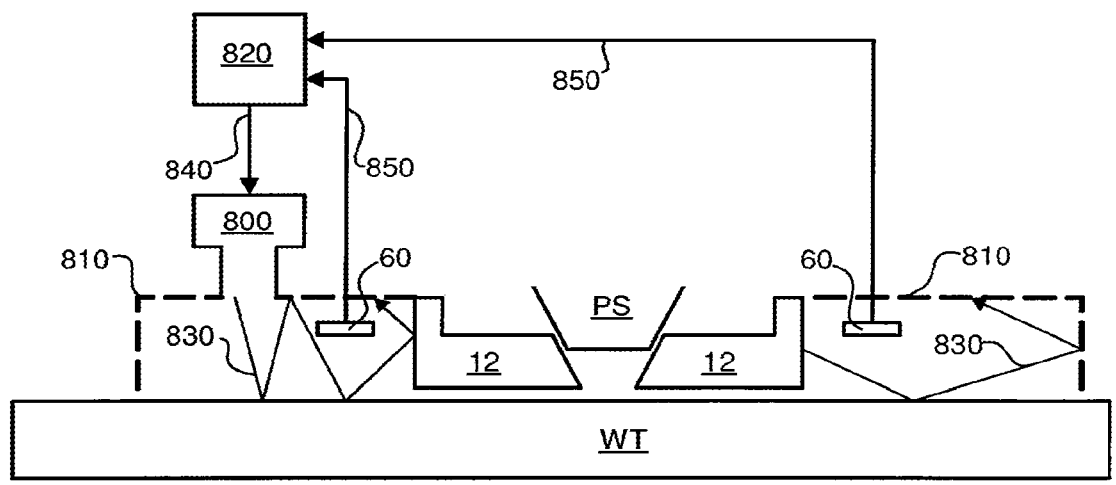
FIG. 22 depicts a microwave source and microwave containment cage for heating immersion liquid on the substrate surface.

FIG. 22 shows an example arrangement, comprising a microwave source 800, configured to provide microwave radiation suitable to heat the immersion liquid being used, and a microwave containment cage 810, designed to contain the microwave radiation within a region of interest (and to protect regions, such as the immersion liquid reservoir 25, where heating is not desirable). In the embodiment shown, the region of interest covers a substantially peripheral region of the substrate W surrounding the barrier member 12. The size of the region covered by the microwave containment cage 810 may be chosen to be large enough that the microwave radiation can completely evaporate liquid left behind in the wake of the barrier member 12 before the substrate table WT has moved far enough relative to the barrier member 12 that the liquid would leave the region exposed to the microwaves. The size of the microwave containment cage 810 should therefore be a function of the intensity of the microwave radiation to be maintained in the containment cage 810, the speed at which the substrate table WT moves under the barrier member 12, and the quantity of liquid that is expected to be left behind in the wake of the barrier member 12.

The microwave containment cage 810 may be formed from a metallic material, with openings of a size suitable to ensure substantially complete reflection of the microwaves. Propagation of the microwave radiation within the microwave containment cage 810 is shown schematically via arrows 830. The power of the microwave source 800, which determines the rate at which liquid left behind on the substrate W will be heated, may be selected on the basis of calibration measurements. For example, test measurements may be carried out for a number of different microwave source powers in order to determine which power leads to a minimum overlay error, for example. Alternatively, one or more temperature sensors 60 may be provided and incorporated into a feedback loop controlled by a microwave source controller 820 via data connection 850, the microwave source controller 820 configured to control the microwave source 800 via data connection 840. This arrangement may be advantageous where the speed of the substrate table WT varies with time and/or when the amount of immersion liquid escaping from the barrier member 12 varies. The feedback mechanism may also be useful when the microwave heating arrangement is to be used in combination with other temperature compensation methods, which may vary in efficiency with time. As in the feedback arrangements discussed above, the feedback loop here may involve adjusting the power of the microwave source 800 in order that the temperatures measured by the temperature sensor(s) 60 converge towards one or more target temperatures. It is envisaged that the microwave source 800 will emit microwave wavelength radiation. However, if the wavelength of radiation that couples most effectively to the immersion liquid being used happens to be outside of the conventional range of wavelengths normally associated with microwaves, it is to be understood that the source 800 could be adapted to emit the appropriate wavelengths of radiation (for example, in the infrared or visible spectra).

Figure 23:
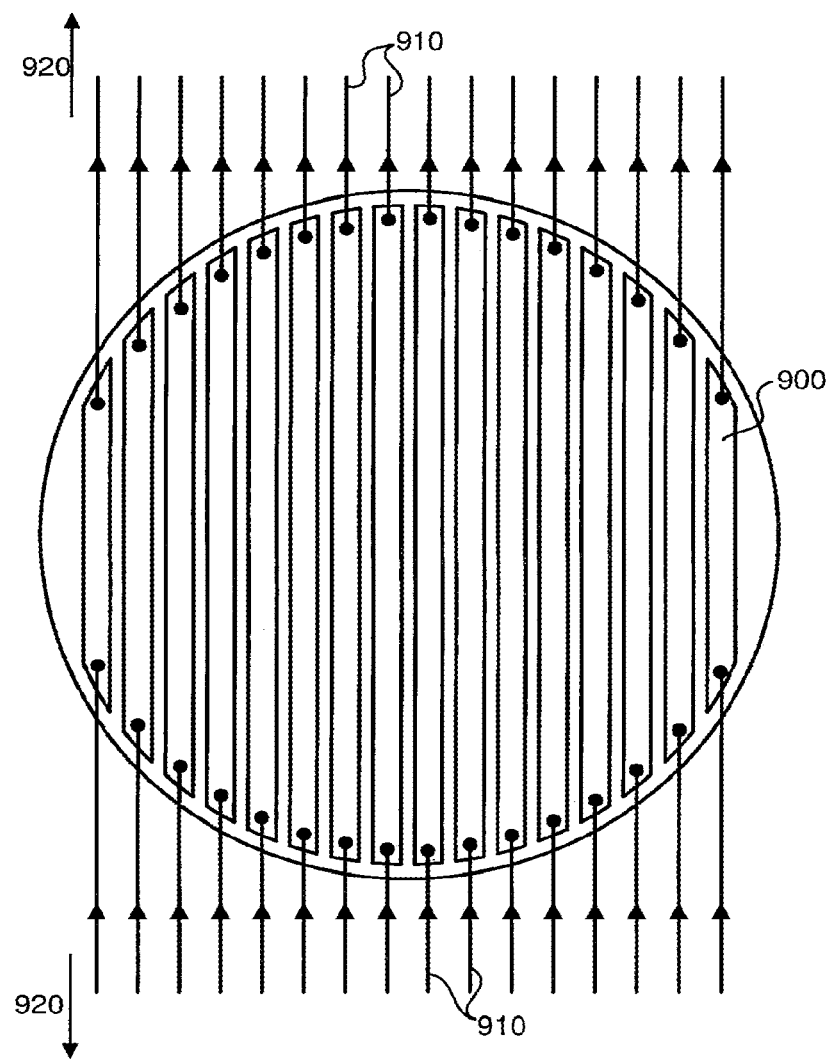
FIG. 23 depicts an arrangement of resistive heating strips and associated electrical current flow.

FIG. 23 shows an arrangement of substrate heaters that can adjust the spatial variation in heat output according to the spatial variation in substrate temperature without the need for a complex arrangement of temperature sensors and/or external control systems. This is achieved by forming one or more electrically conductive strips 900 near the surface of the substrate table WT, in good thermal contact with the substrate W. For example, the electrically conductive strip(s) 900 may be formed by coating an electrically conductive material on a top surface of the substrate table WT. In the embodiment shown, an external current source 920 (not shown) is provided that passes a constant current 910 through each of the one or more electrically conductive strips 900. According to a first variation, a single current source 920 may be provided that passes the same current through each of the one or more electrically conductive strips 900. Alternatively, a plurality of current sources 920 may be provided that are configured to pass different currents through the one or more electrically conductive strips 900. In either case, the current that is passed through each electrically conductive strip should be held constant so that the rate of heat produced by resistive heating per unit length depends only on the local resistivity of the material forming the electrically conductive strips 900. According to the present embodiment, the material is chosen to have a negative temperature dependence (i.e. so that an increase in temperature leads to a decrease in resistivity), desirably a strongly negative temperature dependence, so that significantly more heat is generated in cooler regions (which have higher resistivity) than in relatively warmer regions of each of the electrically conductive strips 900. In this way, more heating power is naturally directed to those regions which need to be heated the most, thus reducing temperature gradients. In particular, the current 910 may be varied until the difference in heating power between the cooler regions and the warmer regions is such as to substantially compensate the heat extracted by evaporation of liquid on the surface of the substrate W (which, as discussed above, may be a major contributor to substrate temperature inhomogeneity). The heat generated in any given segment of one of the electrically conductive strips is expected to be proportional to the square of the current multiplied by the resistance of the segment.

Figure 24:
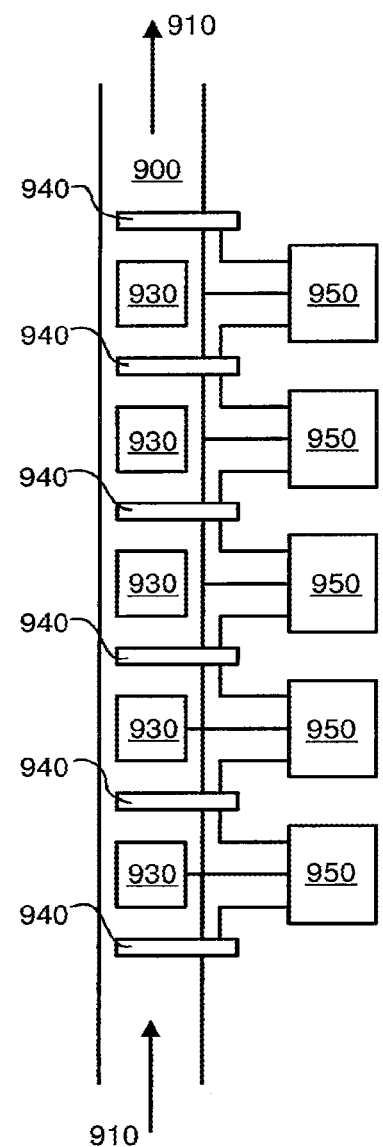
FIG. 24 depicts a single resistive strip used as a local temperature sensor for a system of local heaters.

In the above embodiment, the temperature dependent resistivity of the electrically conductive strip(s) 900 was used directly to provide temperature dependent substrate heating by using the one or more electrically conductive strips themselves as heaters. According to an alternative embodiment of the invention, the one or more electrically conductive strips 900 can be used as one or more temperature sensors, possibly in combination with their function as one or more heating elements. FIG. 24 shows an arrangement according to this embodiment. Again, a current 910 is passed through an electrically conductive strip 900, which is arranged to have a temperature dependent resistivity. In an embodiment, as before, the temperature dependent resistivity is strongly negative, but a weaker temperature dependence and/or a positive temperature dependence may still be tolerable. According to this embodiment, one or more separate local substrate heaters 930 are provided which are each powered by a localized power supply/amplifier 950. The power supplied to each substrate heater 930 is controlled by reference to a measurement of the local resistivity in a segment of an electrically conductive strip 900 that is closest to the substrate heater 930 in question. This may be achieved, for example, by measuring the potential difference between the nearest pair of electrodes 940, as shown in FIG. 24. As before, the local resistivity of the electrically conductive strip 900 is a function of the local temperature.

Calibration measurements may be used to establish the relationship between the resistivity and the local temperature of the substrate W and the power supply/amplifier 950 may be configured to adjust the power of the substrate heater 930 based on the difference between the measured resistivity and the resistivity corresponding to a desired temperature.

The above arrangement may have an advantage of not being restricted by the strength of the temperature dependence of the resistivity of the electrically conductive strip(s) 900 and can, in principle, provide a more strongly spatially dependent heating power to the substrate W. Providing a large number of pairs of power supplies/amplifiers 950 and substrate heaters 930 allows a high spatial resolution. In addition, because the heating power to be provided to the substrate heater 930 is determined via a simple measurement of the resistivity of a nearby segment of an electrically conductive strip 900, there is no need for complex and bulky electronics at the substrate table level, or for complex control electronics provided externally. The amplification factor (or amplification function: the function describing how the local heater power should vary as the temperature offset from the desired temperature varies) provided by the one or more power supplies/amplifiers 950 may be determined beforehand by reference to calibration measurements and may be provided in hardware.

Figure 25:
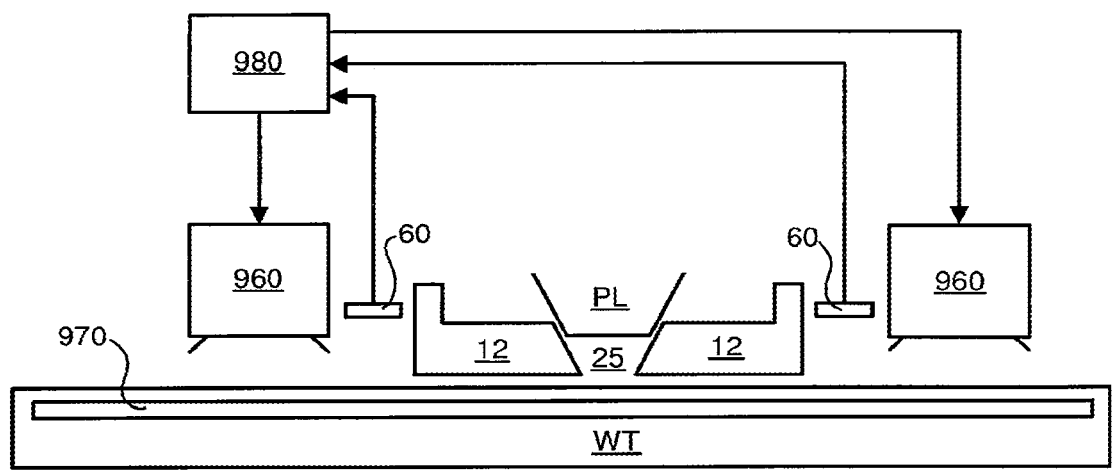
FIG. 25 depicts an arrangement for inductive heating of the substrate table WT.

FIG. 25 shows an embodiment of the invention in which the substrate W is heated by induction heaters. This approach may have an advantage that heating is provided predominantly where it is required (e.g. in the proximity of the barrier member 12). An induction source 960 acts to provide the induction heating power by coupling to an induction element 970 formed within the substrate table WT and, in an embodiment, in a position so as to be in good thermal contact with the substrate W. The power output of the induction source 960 is controlled in turn by an induction controller 980. The induction controller 980 may vary the power of the induction source 960 according to a pre-set routine (for example, so as to heat predominantly the region of the substrate W which recently passed the barrier member 12). A plurality of spatially separated induction sources and/or elements may be provided, each configurable, for example, to provide the same or a different heating power, in order that heating may be provided to the substrate W in such a way that temperature gradients may be reduced. Alternatively, the induction controller 980 may use a feedback model. This may be configured to vary the output power of the one or more induction sources 960 so that the temperature measured by one or more temperature sensors 60 (connected to the induction controller 980) converge on one or more corresponding target temperatures. The use of induction heating to heat the substrate table WT may have a further advantage in that only minor alterations may need to be made to the substrate table WT (such as adding the induction element 970). Therefore, the mechanical operation of the substrate table WT may not be significantly interfered with. The fact that the induction source 960 is mechanically separated from the induction element 970 is advantageous also from the point of view of upgradeability: each component may be adapted to a large extent independently of the other.

Figure 26:
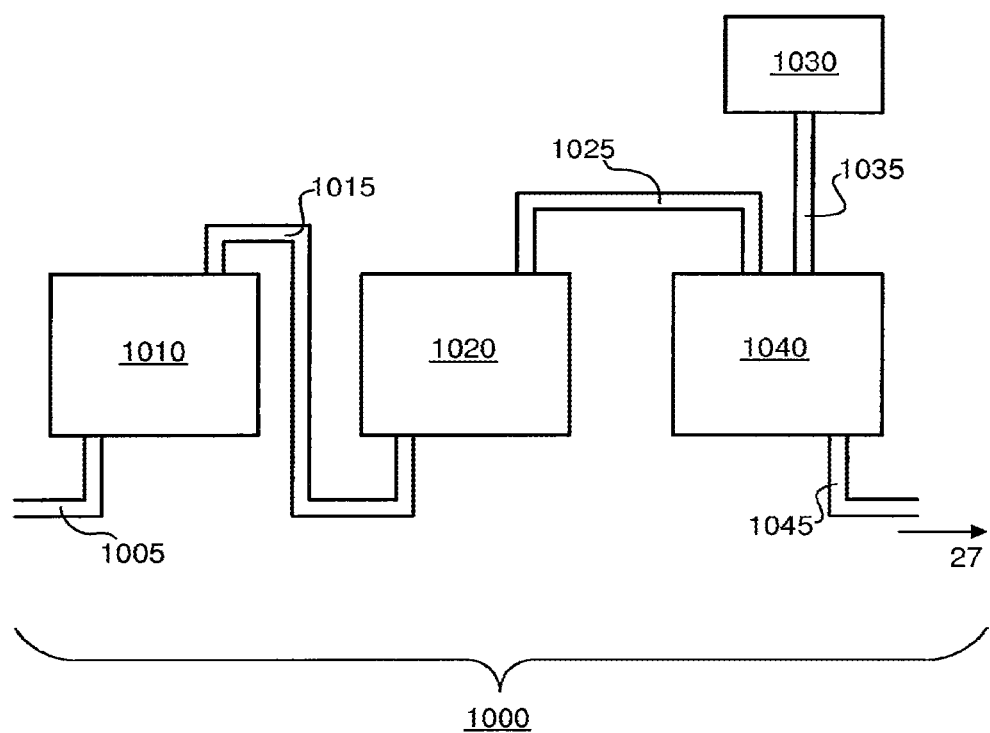
FIG. 26 depicts apparatus for producing a flow of gas with a controlled level of humidity.

As described above, one approach to reducing cooling caused by immersion liquid evaporating from the surface of the substrate W, is to supply humidified gas to the gas seal 27 ("humidified gas" being understood in a broad sense to mean gas that contains a significant proportion of the immersion liquid in vapor form). Where the atmosphere above the substrate W contains a higher proportion of immersion liquid vapor, the dynamic equilibrium that is established between evaporation of the liquid from the substrate W and condensation of the liquid vapor onto the substrate W is such that the net evaporation rate is lower than if the atmosphere above the substrate W was dry (i.e. not containing any significant quantity of immersion liquid vapor). In order for this mechanism to work in a reproducible and consistent manner, a reliable mechanism to humidify the gas supplied to the gas seal 27 should be provided. According to an embodiment, which is illustrated schematically in FIG. 26, a humidifying section 1000 is provided for this purpose. Gas is input to the humidifying section 1000 from a clean gas source (for example) via conduit 1005 to evaporation vessel 1010. The evaporation vessel 1010 comprises one or more internal heating elements that heat one or more baths of immersion liquid in order to produce immersion liquid vapor. The immersion liquid vapor thus produced is mixed with the clean gas supplied via conduit 1005 and output from the evaporation vessel 1010 via conduit 1015. The partially saturated gas is then input to condensation vessel 1020 (also referred to as a "cooling vessel"), in which it is cooled to such an extent that the mixture of gas and immersion liquid vapor becomes over saturated and immersion liquid condenses out of the mixture. What remains in gaseous form is very close to or exactly 100% saturated with immersion liquid vapor at the working temperature of the condensation vessel 1020. This 100% saturated gas supply is then input via conduit 1025 to mixing chamber 1040 where it may be mixed with a source of dry gas input at a controlled rate via conduit 1035 from dry gas source 1030 in order to enable the output of gas, via conduit 1045, at a controlled temperature and/or controlled level of saturation, which may then be supplied to the gas seal 27, for example.

An alternative system for humidifying gas is to pass it through a so-called bubbler, which is a porous device immersed in a vessel containing liquid and liquid vapor. The gas becomes increasingly saturated with liquid as it passes through. However, it may be difficult in this arrangement to control the level of saturation or humidity of the gas that is produced. Variations in flow, in vessel temperature, or in liquid level may all influence the amount of liquid vapor held in the gas that leaves the system. In particular, it may be difficult to achieve 100% saturation using this method. Optimizing the performance of such a system may require the design of a relatively complex apparatus, for example to ensure adequate and reproducible contact between the liquid and gas.

As described above, evaporation of immersion liquid from the substrate W may have negative effects on the performance of the lithographic apparatus. Contamination in the liquid may cause particle contamination (also known as water stains) on the substrate W. Evaporation may also negatively effect overlay performance, focus and optical performance because of cooling effects. Humidified gas in the gas seal 27 may be used to minimize evaporation. According to one approach, 100% saturated gas is desirable so as to achieve zero net evaporation from the surface of the substrate W. An embodiment has been described above that is designed to produce 100% saturated gas in a controlled manner. However, the relative humidity of the gas inevitably drops as it is output from the gas seal 27 due to expansion of the gas. In practice, this may mean that at the point of use (i.e. at the substrate surface) the maximum achievable humidity may be substantially lower than 100%, for example around 60%, when the gas is delivered at the working temperature of the substrate W (for example 22° C.). If an atmosphere of less than 100% relative humidity is maintained above the substrate surface, some net evaporation will occur.

Figure 27:
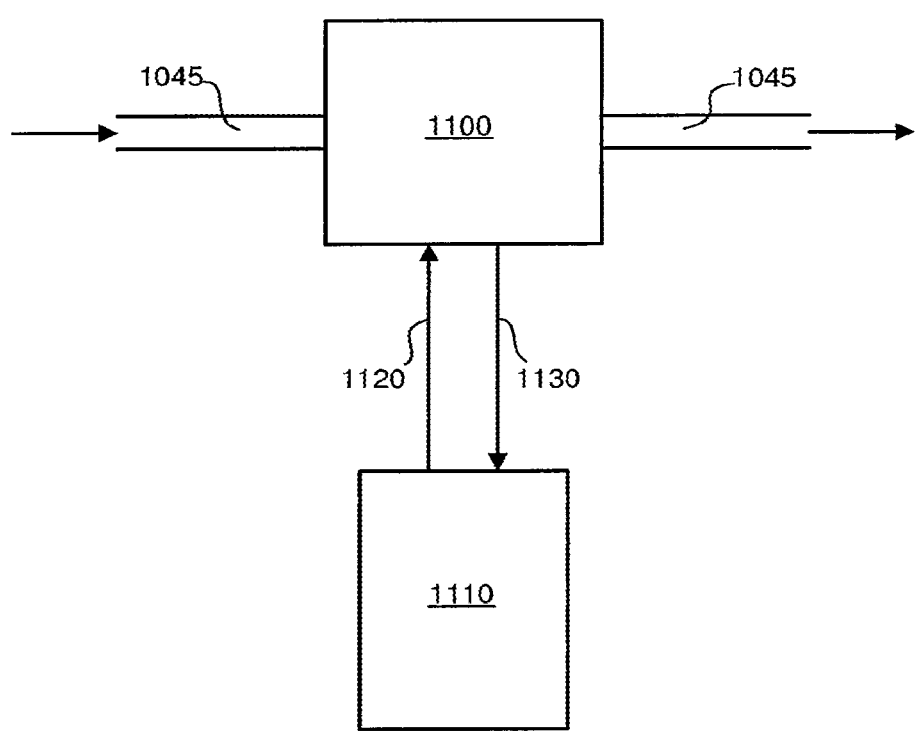
FIG. 27 depicts a heat exchanger for controlling the temperature of a gas flow.

According to an embodiment, which is illustrated schematically in FIG. 27, the humidity of the gas after it has left the gas seal 27 and has expanded, is controlled (increased) by increasing the temperature of the gas supplied to the gas seal.

In this scenario, the hot gas leaving the gas seal 27 is suddenly exposed to an environment at a lower temperature (i.e. the normal working temperature of the lithographic apparatus) and cools. Cooling tends to increase the level of saturation or relative humidity. The overall temperature drop may be controlled to compensate closely for the expansion of the gas and the associated reduction in saturation.

For a typical system maintained at a working temperature of 22° C. with gas supplied to the gas seal 27 close to saturation (for example 90-100% relative humidity), and a typical barrier member pressure drop of 0.4 bars, a temperature offset of between 1 and 5 K may be adequate for maintaining near 100% relative humidity in the gas left above the substrate W outside of the gas seal 27. Careful design of the system may be required to prevent condensation of the highly saturated gas before it leaves the gas seal 27. For example, the walls of the conduit leading to the gas seal 27 through the barrier member 12 should be thermally insulated so as to isolate the hot gas from the cool barrier member 12 and prevent condensation on the walls of the conduit.

FIG. 27, mentioned above, shows an example arrangement for controlling the temperature of the gas to be supplied to the gas seal 27, which may be positioned, for example, between the humidifying section 1000 and the gas seal 27. Relatively cool saturated gas is supplied by conduit 1045 to heat exchanger 1100, which heats the saturated gas to a target temperature by exchanging heat with a heat exchange fluid provided by heater 1110. The heater 1110 provides heat exchange fluid via output line 1120 at temperature T1 and receives heat exchange fluid via input line 1130 at temperature T2, where T1 is greater than T2. The heater 1110 may heat the heat exchange fluid by means of a Peltier heater, for example. According to an example arrangement, a Peltier heater is provided that works in the 500 watt to 1500 watt range to generate temperature controlled liquid (e.g., water) to an accuracy of ±0.01° C. with a set point of 27° C.

Figure 28:
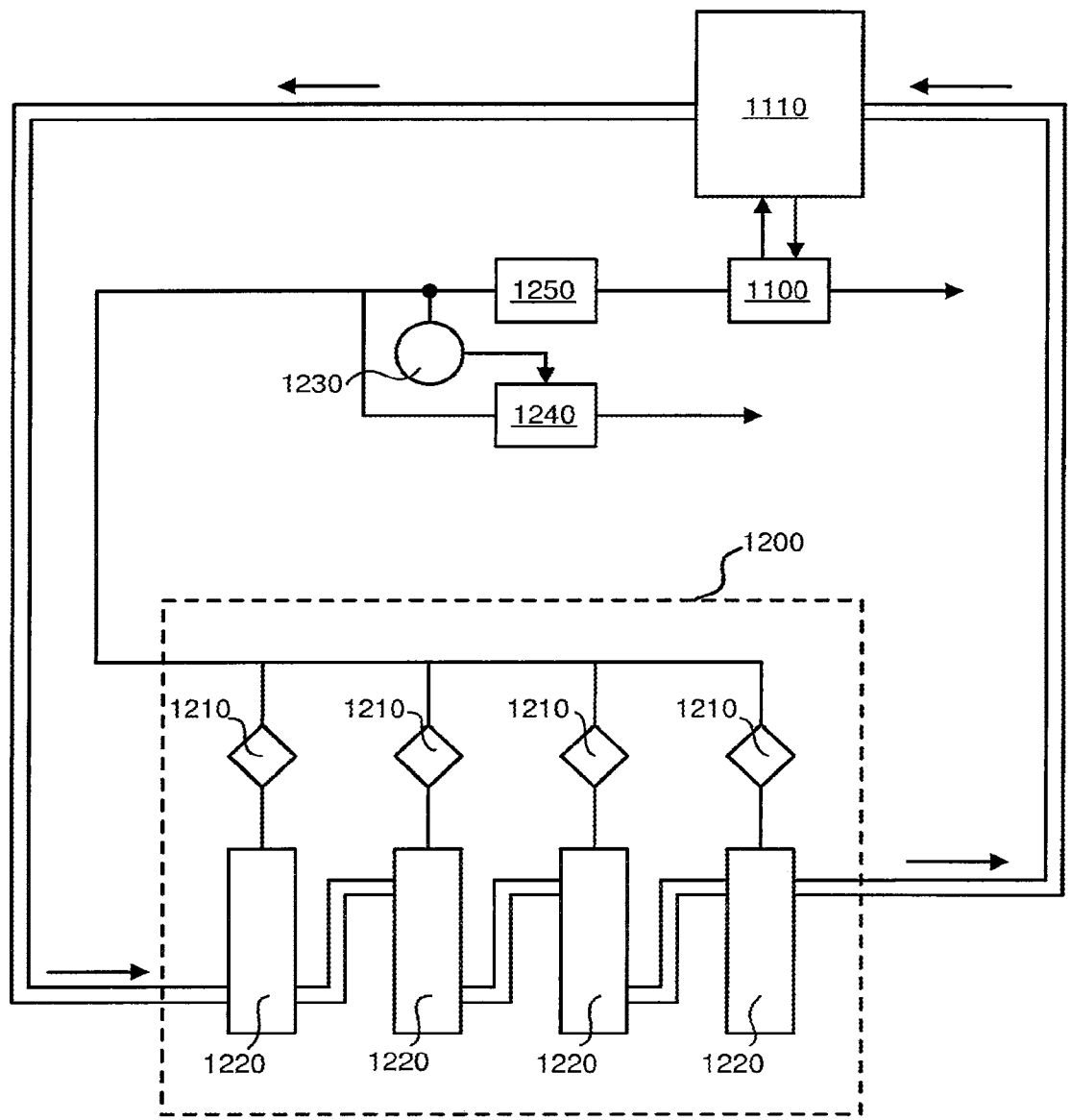
FIG. 28 depicts a venting system for enabling stable operation of a humidifier cabinet.

According to an embodiment of the invention illustrated schematically in FIG. 28, a highly purified stream of humidified gas is created using a humidifier cabinet 1200, in which several evaporating units 1220 in parallel act to evaporate liquid. The temperature of the humidified gas produced is controlled by supplying to each of the evaporators 1220 a stream of temperature controlled heat exchange fluid by conduit 1205. The heat exchange fluid may be provided by heat exchange fluid source 1110, which may also be used to control the temperature of the saturated gas just before it is fed to the gas seal 27 as described above. Alternatively, a separate heat exchange fluid source may be provided. The humidified and temperature controlled gas is passed via hydrophobic filters 1210 to output valve 1250 before being passed via heat exchanger 1100 to the gas seal 27.

Changing or even stopping the humidified gas flow from the humidifier cabinet 1200 changes the equilibrium and may require a long stabilization time before humidified gas may again be supplied to the gas seal 27 with a well controlled temperature and degree of saturation. However, due to the dynamic nature of the task performed by the barrier member 12 and gas seal 27, the rate of gas required by the gas seal 27 may vary considerably with time: for example, there may be short periods where the gas seal 27 does not function. Rather than adapt the system so that it can stabilize more quickly, which might require substantial and complex additional apparatus, the present embodiment includes a variable vent system 1240 which allows gas to be vented at a controlled rate to an external reservoir or to an exhaust. The vent system 1240 can be configured such that the flow from the humidifier cabinet 1200 remains constant. This may be achieved in practice by ensuring that the total flow through main valve 1250 and vent system 1240 is constant. This may be implemented by configuring the vent system 1240 to have a flow impedance that is responsive to the reading of pressure gauge 1230, which corresponds to the backpressure "felt" by the humidifier cabinet 1200. In particular, this pressure should be kept constant. This arrangement provides not only for better stability but also higher throughput because the need for a stabilization time between different operational phases of the gas seal 27 may be avoided.

All of the above features can be combined in any combination and applied where relevant to all types of liquid supply system including those mentioned in the background section above.

In an embodiment, there is provided a lithographic apparatus, comprising: a substrate table constructed to hold a substrate; a projection system configured to project a patterned radiation beam onto a target portion of the substrate; a liquid supply system configured to at least partly fill a space between the projection system and the substrate with liquid; a barrier member arranged to substantially contain the liquid within the space between the projection system and the substrate; and a liquid evaporation controller arranged to control a net rate of evaporation of liquid supplied by the liquid supply system.

In an embodiment, the apparatus further comprises a gas seal connected to a gas source, configured to control the amount of liquid that escapes from the barrier member through a gap delimited on one side by a boundary of the barrier member and on a second side by the substrate, wherein the liquid evaporation controller comprises a gas humidity controller configured to interact with the gas source to provide gas with a controlled relative humidity of greater than about 10%. In an embodiment, the gas humidity controller is configured to produce a stream of humidity-controlled gas at a constant flow rate and comprises a gas seal flow-rate controller configured to receive the constant stream from the humidity controller and vary the rate of flow of gas to the gas seal by selectively venting a portion of the constant stream supplied by the humidity controller to an external reservoir. In an embodiment, the humidity controller comprises a humidifying section configured to humidify a stream of gas to a controlled extent, the humidifying section comprising: an evaporation vessel configured to receive a stream of relatively dry gas and at least partially humidify the stream of gas with liquid vapor evaporated from a bath; and a cooling vessel configured to be held at a temperature substantially lower than that of the evaporation vessel and to receive and cool the at least partially humidified gas stream in order to obtain a stream of completely saturated gas. In an embodiment, a saturated gas output of the cooling vessel is connectable to a dry gas source, and wherein the gas humidity controller is configured to adjust the rate at which dry gas is mixed with the stream of saturated gas output from the cooling vessel in order to obtain a stream of gas with a controlled relative humidity level. In an embodiment, the apparatus further comprises a gas temperature controller arranged to interact with the gas source to control the temperature of the gas supplied to the gas seal, wherein the temperature of the gas before entering the gas seal is arranged to be higher than the average temperature of the substrate. In an embodiment, the temperature of the gas before entering the gas seal is arranged to be between 1 and 5 K higher than the average temperature of the substrate. In an embodiment, the temperature of the humidified gas supplied to the gas seal is such as to achieve a desired level of humidity after expansion of the gas in the gas seal. In an embodiment, the gas humidity controller is configured to provide gas with a relative humidity greater than 40%. In an embodiment, the apparatus further comprises a temperature sensor configured to measure the temperature of at least a portion of the substrate, or at least a portion of the substrate table, or at least a portion of a substrate holder, or any combination thereof, and wherein the humidity controller is capable of adjusting the relative humidity of the gas supplied by the gas source so as to reduce a difference between the temperature measured by the temperature sensor and a target temperature. In an embodiment, the liquid evaporation controller comprises a gas-shower outlet configured to supply gas with a controlled relative humidity of greater than about 10% to the region outside of the barrier member between the substrate and the projection system. In an embodiment, the gas-shower outlet is configured to supply gas with a relative humidity in the range of about 40% to about 50%. In an embodiment, the apparatus further comprises: a temperature sensor configured to measure the temperature of at least a portion of the substrate, or at least a portion of the substrate table, or at least a portion of a substrate holder, or any combination thereof; and a gas-shower outlet controller capable of adjusting the relative humidity of the gas supplied by the gas-shower outlet so as to reduce a difference between the temperature measured by the temperature sensor and a target temperature. In an embodiment, the apparatus further comprises: a gas seal connected to a gas source, configured to control the amount of liquid that escapes from the barrier member through a gap, delimited on one side by a boundary of the barrier member and on a second side by the substrate, wherein the gas source provides gas with a controlled relative humidity of greater than 10%; and a gas-shower outlet configured to supply gas with a controlled relative humidity, substantially equal to that of the gas supplied by the gas source, to the region outside of the barrier member between the substrate and the projection system.

In an embodiment, there is provided a lithographic apparatus, comprising: a substrate table constructed to hold a substrate; a projection system configured to project a patterned radiation beam onto a target portion of the substrate; a liquid supply system configured to at least partly fill a space between the projection system and the substrate with liquid; a barrier member arranged to substantially contain the liquid within the space between the projection system and the substrate; a substrate table displacement system, arranged to move the substrate table along a predetermined path relative to the barrier member, thereby moving the target portion over the surface of the substrate; and a microwave source and microwave containment device, together configured to supply heat to liquid on the surface of the substrate.

In an embodiment, the microwave containment device comprises a metallic cage and defines a volume within which microwave radiation produced by the microwave source can propagate. In an embodiment, the microwave containment device is fixed relative to the barrier member and the volume extends to cover only a sub-region of the surface of the substrate around the barrier member, at any one time.

In an embodiment, there is provided a lithographic apparatus, comprising: a substrate table constructed to hold a substrate; a projection system configured to project a patterned radiation beam onto a target portion of the substrate; a liquid supply system configured to at least partly fill a space between the projection system and the substrate with liquid; a barrier member arranged to substantially contain the liquid within the space between the projection system and the substrate; a substrate table displacement system, arranged to move the substrate table along a predetermined path relative to the barrier member, thereby moving the target portion over the surface of the substrate; and a substrate heater configured to heat at least a portion of the substrate according to a position of the substrate table relative to the barrier member, or a velocity of the substrate table relative to the barrier member, or an acceleration of the substrate table relative to the barrier member, or a predetermined path of the substrate table relative to the barrier member, or a local substrate temperature, or a local substrate table temperature, or any combination thereof.

In an embodiment, the substrate heater comprises an induction heater, or a visible-light source, or an infrared emission source, or a glow wire electrical resistance heater, or a temperature-controlled gas jet, or any combination thereof. In an embodiment, the induction heater is configured to heat the substrate via an induction plate associated with the substrate table and formed of a material suitable for induction heating. In an embodiment, the substrate heater comprises a plurality of local heaters, each capable of heating substantially separate portions of the substrate, wherein the local heaters are arranged to be switched to a heat emitting state when positioned to heat a region of the substrate over which the barrier member has already passed, and to be switched to a non-heat emitting state when positioned to heat a region of the substrate over which the barrier member has yet to pass. In an embodiment, the apparatus further comprises a substrate table path determining device, configured to determine the position of the substrate table, or the velocity of the substrate table, or the acceleration of the substrate table, or the predetermined path of the substrate table, or any combination thereof. In an embodiment, the substrate heater comprises a plurality of remote heaters positioned around the periphery of the barrier member. In an embodiment, the power output of the remote heaters is controlled depending on the direction of motion of the substrate table relative to the barrier member, as determined by a substrate table path determining device. In an embodiment, remote heaters at positions closest to a leading edge of the barrier member are configured to provide a lower power output than remote heaters positioned closest to a trailing edge of the barrier member. In an embodiment, the apparatus further comprises: a temperature sensor configured to measure the temperature of at least a portion of the substrate, or of at least a portion of the substrate table, or of at least a portion of a substrate holder, or any combination thereof; and a substrate temperature controller, arranged to control the output of each of the plurality of remote heaters so as to reduce a difference between the temperature measured by the temperature sensor and a target temperature. In an embodiment, the temperature sensor comprises a radiation capture and analysis device capable of determining an intensity spectrum of captured radiation over a range of wavelengths including infrared. In an embodiment, the substrate heater comprises a local heater arranged to heat predominantly a distinct portion of the substrate and the apparatus further comprises: a temperature sensor configured to measure a temperature of at least a portion of the substrate, or of at least a portion of the substrate table, or of at least a portion of a substrate holder, or any combination thereof; and a substrate temperature controller, arranged to control the output of the local heater so as to reduce a difference between the temperature measured by the temperature sensor and a target temperature. In an embodiment, the local heater is arranged to follow substantially a predetermined path of the substrate table relative to the barrier member. In an embodiment, the substrate heater comprises a liquid temperature controller arranged to interact with the liquid supply system to control the temperature of the liquid to be filled in the space between the projection system to a temperature greater than about 295 K. In an embodiment, the apparatus further comprises a gas seal configured to control the amount of liquid that escapes from the barrier member through a gap delimited on one side by a boundary of the barrier member and on a second side by the substrate, the gas seal being supplied with pressurized gas by a pressurized gas supply system, and wherein the substrate heater comprises a gas temperature controller arranged to interact with the pressurized gas supply system to control the temperature of the pressurized gas supplied to the gas seal to a temperature greater than about 300 K. In an embodiment, the substrate heater comprises elongated elements arranged in substantially parallel strips, the strips being oriented substantially perpendicular to a scanning direction of the substrate table relative to the barrier member, the separation of the strips being arranged to increase progressively from a first strip, corresponding to a region of a substrate in which the projection system is configured to project the radiation beam during a first time period, to a final strip, corresponding to a region of the same substrate in which the projection system is configured to project the radiation beam during a time period later than the first time period. In an embodiment, each substantially parallel strip provides a uniform power per unit length along its length. In an embodiment, the substrate heater comprises elongated elements arranged in substantially parallel strips, the strips being oriented substantially perpendicular to a scanning direction of the substrate table relative to the barrier member, and wherein the strips are arranged to provide a progressively decreasing power per unit length of strip from a first strip, corresponding to a region of a substrate in which the projection system is configured to project the radiation beam during a first time period, to a final strip, corresponding to a region of the same substrate in which the projection system is configured to project the radiation beam during a time period later than the first time period. In an embodiment, the substrate heater is arranged to provide a higher heating power at target regions on a substrate where the projection system is configured to project the patterned radiation beam at a first time and progressively lower heating powers at target regions on the same substrate where the projection system is configured to project the patterned radiation beam at later times. In an embodiment, the substrate heater comprises an array of individually addressable local heaters and a heater array controller adapted to control actuation of the individually addressable local heaters according to a predetermined algorithm, the predetermined algorithm controlling actuation with respect to heater position, or timing, or amount of heat generated, or a rate of heat generated, or any combination thereof. In an embodiment, the substrate heater comprises: an electrically conductive strip arranged to be in good thermal contact with a portion of the substrate, the resistivity of the electrically conductive strip selected so that resistive heating from electrical current is higher in relatively cooler regions of the substrate than it is in relatively warmer regions of the substrate; and a current source configured to pass a current of controlled magnitude through the electrically conductive strip. In an embodiment, the magnitude of the current is such as to minimize a temperature gradient caused by evaporation of liquid from the surface of the substrate. In an embodiment, the conductive strip is formed from a material with an electrical resistance that decreases with increasing temperature. In an embodiment, the apparatus further comprises a plurality of local substrate heaters, each configured to supply heat to a localized sub-region of the substrate; a local substrate heater controller configured to control the output power of at least a subset of the plurality of local substrate heaters; and a plurality of resistivity measuring devices, each configured to measure the resistivity of at least a portion of the electrically conductive strip, wherein the output power of each of the local substrate heaters is controlled according to the resistivity of a portion of the electrically conductive strip nearest to the localized sub-region to be heated and measured by one of the resistivity measuring devices. In an embodiment, the apparatus further comprises a constant current source configured to pass a current of controlled magnitude through the electrically conductive strip and wherein one of the resistivity measuring devices operates by measuring a potential difference arising between at least two points on the electrically conductive strip.

In an embodiment, there is provided a device manufacturing method, comprising: projecting a patterned radiation beam through a liquid onto a target portion of a substrate; and controlling a net rate of evaporation of the liquid.

In an embodiment, there is provided a device manufacturing method, comprising: projecting a patterned radiation beam through a liquid onto a target portion of the substrate; moving a substrate table holding the substrate along a predetermined path relative to a seal member used to contain the liquid, thereby moving the target portion over a surface of the substrate; and heating liquid on the surface of the substrate using microwaves.

In an embodiment, there is provided a device manufacturing method, comprising: projecting a patterned radiation beam through a liquid onto a target portion of a substrate; moving a substrate table holding the substrate along a predetermined path relative to a seal member used to contain the liquid, thereby moving the target portion over a surface of the substrate; and heating at least a portion of the substrate according to a position of the substrate table relative to the seal member, or a velocity of the substrate table relative to the seal member, or an acceleration of the substrate table relative to the seal member, or a predetermined path of the substrate table relative to the seal member, or a local substrate temperature, or a local substrate table temperature, or any combination thereof.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A substrate stage component for a lithographic apparatus configured to project radiation onto a radiation-sensitive substrate, the substrate stage component comprising:
   a movable support body configured to support the substrate in the lithographic apparatus, the support body comprising a plurality of protrusions to support the substrate; and
   a heater configured to heat at least a portion of the substrate and/or substrate stage component, at least part of the heater located on an external surface of the support body, the at least part comprising a portion of a heat emitting element of the heater.

2. The component of claim 1, further comprising a fluid-carrying channel configured to flow a fluid through at least part of the support body to enable heat transfer between the fluid and the at least part of the support body and/or the substrate, a first port configured to connect to piping to allow the fluid into the fluid-carrying channel, and a second port separate from the first port and configured to connect to piping to allow the fluid to flow out of the fluid-carrying channel.

3. The component of claim 2, wherein at least part of the channel forms an essentially circular channel portion along a peripheral edge of the support body.

4. The component of claim 1, further comprising a control program configured to control the heater based on a position of the support body, or a velocity of the support body, or an acceleration of the support body, or at least part of a predetermined path of the support body, or a local substrate temperature, or a local support body temperature, or any combination selected therefrom.

5. The component of claim 1, further comprising an array of temperature sensors configured to measure a temperature of at least a portion of the substrate and/or substrate stage component.

6. A lithographic apparatus comprising:
   a projection system configured to project a patterned radiation beam onto a substrate;
   a liquid supply system configured to at least partly fill a space between the projection system and the substrate with liquid; and
   the component of claim 1.

7. The component of claim 1, wherein the heater comprises a plurality of heating elements, the heating elements being individually controllable.

8. A substrate stage component for a lithographic apparatus configured to project radiation onto a radiation-sensitive substrate, the substrate stage component comprising:
   a movable support body configured to support the substrate in the lithographic apparatus, the support body comprising a plurality of protrusions to support the substrate;
   a fluid-carrying channel configured to flow a fluid through at least part of the movable support body to enable heat transfer between the fluid and the at least part of the support body and/or the substrate;
   a first port configured to connect to piping to allow the fluid into the fluid-carrying channel, and a second port separate from the first port and configured to connect to piping to allow the fluid to flow out of the fluid-carrying channel; and
   an electric heater attached to the movable support body and configured to locally heat at least a portion of the substrate and/or substrate stage component.

9. The component of claim 8, wherein at least part of the heater is located on an external surface of the support body.

10. The component of claim 8, wherein at least part of the channel forms an essentially circular channel portion along a peripheral edge of the support body.

11. The component of claim 8, further comprising a control program configured to control the heater based on a position of the support body, or a velocity of the support body, or an acceleration of the support body, or at least part of a predetermined path of the support body, or a local substrate temperature, or a local support body temperature, or any combination selected therefrom.

12. The component of claim 8, further comprising an array of temperature sensors configured to measure a temperature of at least a portion of the substrate and/or substrate stage component.

13. A lithographic apparatus comprising:
   a projection system configured to project a patterned radiation beam onto a substrate;

a liquid supply system configured to at least partly fill a space between the projection system and the substrate with liquid; and the component of claim 8.

14. The component of claim 8, wherein the heater comprises a plurality of heating elements, the heating elements being individually controllable.

15. A substrate stage component for a lithographic apparatus configured to project radiation onto a radiation-sensitive substrate, the substrate stage component comprising:
- a movable support body configured to support the substrate in the lithographic apparatus, the support body comprising a plurality of protrusions to support the substrate; and
- a fluid-carrying channel configured to flow a fluid through at least part of the support body to enable heat transfer between the fluid and the at least part of the support body and/or the substrate; and
- a heater configured to heat at least a portion of the substrate and/or substrate stage component, at least a portion of a heat emitting element of the heater located lower than a top of the fluid-carrying channel.

16. The component of claim 15, wherein the heater comprises a plurality of heat emitting elements, the heat emitting elements being individually controllable.

17. The component of claim 15, wherein at least part of the channel forms an essentially circular channel portion along a peripheral edge of the support body.

18. The component of claim 15, further comprising a control program configured to control the heater based on a position of the support body, or a velocity of the support body, or an acceleration of the support body, or at least part of a predetermined path of the support body, or a local substrate temperature, or a local support body temperature, or any combination selected therefrom.

19. The component of claim 15, further comprising an array of temperature sensors configured to measure a temperature of at least a portion of the substrate and/or substrate stage component.

20. A lithographic apparatus comprising:
- a projection system configured to project a patterned radiation beam onto a substrate;
- a liquid supply system configured to at least partly fill a space between the projection system and the substrate with liquid; and the component of claim 15.

* * * * *